US012563934B2

(12) United States Patent
Yun et al.

(10) Patent No.: US 12,563,934 B2
(45) Date of Patent: Feb. 24, 2026

(54) METHOD OF MANUFACTURING DISPLAY DEVICE HAVING DETECTION WIRES WITH VARIED RESISTANCE VALUES

(71) Applicant: SAMSUNG DISPLAY CO., LTD., Yongin-si (KR)

(72) Inventors: Gayeon Yun, Yongin-si (KR); Bongil Kang, Yongin-si (KR); Taejoon Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/008,014

(22) Filed: Jan. 2, 2025

(65) Prior Publication Data

US 2025/0143126 A1     May 1, 2025

Related U.S. Application Data

(62) Division of application No. 18/344,550, filed on Jun. 29, 2023, now Pat. No. 12,219,839.

(30) Foreign Application Priority Data

Oct. 5, 2022     (KR) ........................ 10-2022-0127363

(51) Int. Cl.
*H10K 59/13*        (2023.01)
*G06F 3/041*        (2006.01)
*G06F 3/044*        (2006.01)
        (Continued)

(52) U.S. Cl.
CPC ..... *H10K 59/1315* (2023.02); *G06F 3/04182* (2019.05); *G06F 3/0446* (2019.05);
        (Continued)

(58) Field of Classification Search
CPC ............... G06F 3/04182; G06F 3/0446; G06F 2203/04103; H10K 59/1315;
        (Continued)

(56) References Cited

U.S. PATENT DOCUMENTS

| | | | |
|---|---|---|---|
| 7,050,135 B2 | 5/2006 | Kim | |
| 10,915,210 B2 | 2/2021 | Lee et al. | |

(Continued)

FOREIGN PATENT DOCUMENTS

| | | | | |
|---|---|---|---|---|
| CN | 108780373 A | * 11/2018 | ........... | G06F 3/0448 |
| KR | 10-0806808 B1 | 2/2008 | | |
| KR | 10-1073684 B1 | 10/2011 | | |
| KR | 10-2020-0061056 A | 6/2020 | | |
| KR | 10-2021-0057440 A | 5/2021 | | |

OTHER PUBLICATIONS

Machine Translation of CN-108780373-A (Year: 2018).*

*Primary Examiner* — Liliana Cerullo
(74) *Attorney, Agent, or Firm* — F. CHAU & ASSOCIATES, LLC

(57)        ABSTRACT

A display device includes a display panel, an input sensor, and a circuit board. The input sensor includes first detection electrodes arranged in a first direction, second detection electrodes arranged in a second direction, first detection wires respectively electrically connected to the first detection electrodes, and second detection wires respectively electrically connected to the second detection electrodes. Resistance values of the first detection wires decrease as a corresponding first detection electrode among the first detection electrodes is disposed closer to a center of the display panel. Resistance values of the second detection wires increase as a corresponding second detection electrode among the second detection electrodes moves away from the circuit board, and a difference between the resistance values of the second detection wires adjacent to each other increases as the corresponding second detection electrode moves away from the circuit board.

10 Claims, 19 Drawing Sheets

(51) Int. Cl.

| | |
|---|---|
| *G09G 3/32* | (2016.01) |
| *H10K 59/12* | (2023.01) |
| *H10K 59/121* | (2023.01) |
| *H10K 59/131* | (2023.01) |
| *H10K 59/40* | (2023.01) |

(52) U.S. Cl.
CPC ........... *G09G 3/32* (2013.01); *H10K 59/1201* (2023.02); *H10K 59/1213* (2023.02); *H10K 59/40* (2023.02); *G06F 2203/04103* (2013.01)

(58) Field of Classification Search
CPC ........... H10K 59/1201; H10K 59/1213; H10K 59/40; G09G 3/32
See application file for complete search history.

(56) References Cited

U.S. PATENT DOCUMENTS

| | | | | |
|---|---|---|---|---|
| 11,243,629 | B2 | 2/2022 | Lee et al. | |
| 2011/0050631 | A1 | 3/2011 | Kwon et al. | |
| 2018/0367749 | A1* | 12/2018 | Miyoshi | H10F 39/802 |
| 2020/0057530 | A1 | 2/2020 | Moon et al. | |
| 2020/0167037 | A1 | 5/2020 | Lee et al. | |
| 2020/0293150 | A1 | 9/2020 | Jeong | |
| 2021/0191572 | A1* | 6/2021 | Kwon | G06F 3/0443 |
| 2022/0137742 | A1 | 5/2022 | Kim et al. | |
| 2024/0045546 | A1 | 2/2024 | Xu et al. | |
| 2024/0122019 | A1 | 4/2024 | Yun et al. | |

\* cited by examiner

TL1_1S~TL1_5S:TL1_S

TL2_1S~TL2_7S:TL2_S

TL1_1S~TL1_5S:TL1_S

TL2_1S~TL2_7S:TL2_S

METHOD OF MANUFACTURING DISPLAY DEVICE HAVING DETECTION WIRES WITH VARIED RESISTANCE VALUES

CROSS-REFERENCE TO RELATED APPLICATIONS

This U.S. non-provisional patent application is a Division of co-pending U.S. patent application Ser. No. 18/344,550, filed on Jun. 29, 2023, which claims priority under 35 U.S.C. § 119 to Korean Patent Application No. 10-2022-0127363, filed in the Korean Intellectual Property Office on Oct. 5, 2022, the entire contents of which are hereby incorporated by reference.

TECHNICAL FIELD

The inventive concept relates to a display device and a method for manufacturing the same, and more particularly, to a display device having detection wires with varied resistance values and a method for manufacturing the same.

DISCUSSION OF THE RELATED ART

In general, electronic devices such as smart phones, digital cameras, notebook computers, navigation systems, and smart televisions, which provide images to users, include display devices for displaying images. The display device generates an image and provides the generated image to a user through a display screen.

The display device includes a display panel for generating an image and an input sensor disposed on the display panel to detect an external input, such as the touch of a user. The display panel includes a plurality of pixels for generating an image, and the input sensor includes a plurality of detection electrodes for detecting the external input.

When drive signals for driving the detection electrodes are provided to the detection electrodes, noise generated by the display panel may affect the drive signals, and the drive signals may be distorted thereby.

SUMMARY

A display device includes a display panel including pixels, an input sensor, and a circuit board. The input sensor includes first detection electrodes arranged in a first direction and each extending in a second direction crossing the first direction, second detection electrodes arranged in the second direction and each extending in the first direction, first detection wires respectively electrically connected to the first detection electrodes, and second detection wires respectively electrically connected to the second detection electrodes, and disposed on the display panel. The circuit board is disposed adjacent to an end of the display panel and the circuit board extends in the first direction and is electrically connected to the first and second detection wires. Resistance values of the first detection wires decrease as a corresponding first detection electrode, among the first detection electrodes, is disposed further towards a center of the display panel. Resistance values of the second detection wires increase as a corresponding second detection electrode, among the second detection electrodes, moves away from the circuit board, and a difference between the resistance values of adjacent members of the second detection wires increases as the corresponding second detection electrode moves away from the circuit board.

The display panel may include an active area in which the pixels are disposed and a peripheral area proximate to the active area. The pixel may include a driving circuit including at least one transistor, and a light emitting element including a first electrode electrically connected to the driving circuit, a second electrode, and a light emitting layer disposed between the first and second electrodes. Noise generated from the second electrode may decrease towards a center of the active area in the first direction, and increase away from the circuit board in the second direction. A rate of increase in the second direction of the noise generated from the second electrode may decrease as a distance from the circuit board increases.

A length of each of the first detection electrodes in the second direction may be longer than a length of each of the second detection electrodes in the first direction.

The first detection wires may be respectively electrically connected to ends of the first detection electrodes. The second detection wires may be respectively electrically connected to ends of the second detection electrodes. The ends of the first detection electrodes may be adjacent to the circuit board.

The display panel may further include at least one signal line electrically connected to the pixel and a display pad part to which the at least one signal line is electrically connected. The input sensor may further include an input pad part to which the first and second detection wires are electrically connected. The at least one signal line may be electrically connected to the circuit board through the display pad part, and the first and second detection wires may be electrically connected to the circuit board through the input pad part.

The sensing pad part may be spaced apart from one side of the display pad part.

The sensing pad part may include a first part and a second part spaced apart from the first part on both sides of the display pad. Some of the first detection wires may be electrically connected to the first part and other parts of the first detection wires may be electrically connected to the second part. Each of the second detection wires may be electrically connected to the first part.

The input sensor may further include third detection wires respectively electrically connected to the other ends of the first detection electrodes. Resistance values of the third detection wires may decrease as a corresponding first detection electrode, among the first detection electrodes, is disposed further towards a center of the display panel.

Each of the first and second detection wires may have a single-layer structure or a multi-layer structure.

The input sensor may further include: a guard wire; and a shielding wire disposed beyond the guard wire.

A method for manufacturing a display device includes measuring a level of noise from a reference input sensor using a reference display device including a display panel and the reference input sensor disposed on the display panel and forming a display device including the display panel and an input sensor including first detection electrodes arranged in a first direction, second detection electrodes arranged in a second direction crossing the first direction, first detection wires respectively electrically connected to the first detection electrodes, and second detection wires respectively electrically connected to the second detection electrodes and disposed on the display panel. The forming of the display device includes setting resistances of the first detection wires based on the measured level of noise, setting resistances of the second detection wires based on the measured level of noise, and forming the input sensor on the display panel.

Resistance values of the first detection wires may decrease as a corresponding first detection electrode among the first detection electrodes is disposed further towards a center of the display panel.

The display device may further include a circuit board disposed adjacent to an end of the display panel extending in the first direction and electrically connected to the first and second detection wires. Resistance values of the second detection wires may increase as a corresponding second detection electrode among the second detection electrodes moves away from the circuit board, and a difference between the resistance values of the second detection wires adjacent to each other may increase as the corresponding second detection electrode moves away from the circuit board.

The reference display device may further include a circuit board disposed adjacent to an end of the display panel extending in the first direction. The reference input sensor may include first reference detection electrodes arranged in the first direction, second reference detection electrodes arranged in the second direction, first reference detection wires respectively electrically connected to the first detection electrodes, and second reference detection wires respectively electrically connected to the second detection electrodes. Resistance values of the first reference detection wires may be substantially the same as one another. Resistance values of the second detection wires respectively electrically connected to the second detection electrodes arranged in a direction away from the circuit board may increase at a constant rate.

Noise generated in the first reference detection wires may increase as a corresponding first reference detection electrode among the first reference detection electrodes is disposed further towards a center of the display panel.

The setting of the resistance values of the first detection wires may include setting a tendency of resistance values of the first detection wires based on a tendency of noise generated in the first reference detection wires.

Noise generated in the second reference detection wires may increase as a corresponding second reference detection electrode among the second reference detection electrodes moves away from the circuit board. A noise increase rate between adjacent second reference detection wires may decrease as a corresponding second reference detection electrode moves away from the circuit board.

The setting of the resistance values of the second detection wires may include setting a tendency of resistance values of the second detection wires based on a tendency of noise generated in the second reference detection wires.

The measuring of the noise in the reference input sensor may include measuring a voltage change of each of the first reference detection wires and the second reference detection wires.

The forming of the input sensor may include controlling a length and/or width of each of the first detection wires based on a length and width of each of the first reference detection wires to form the first detection wires, each having a set resistance, and controlling a length and/or width of each of the second detection wires based on a length and width of each of the second reference detection wires to form the second detection wires, each having a set resistance.

BRIEF DESCRIPTION OF THE FIGURES

The accompanying drawings are included to provide a further understanding of the inventive concept, and are incorporated in and constitute a part of this specification.

The drawings illustrate embodiments of the inventive concept and, together with the description, serve to explain principles of the inventive concept. In the drawings.

DETAILED DESCRIPTION

Figure 1:
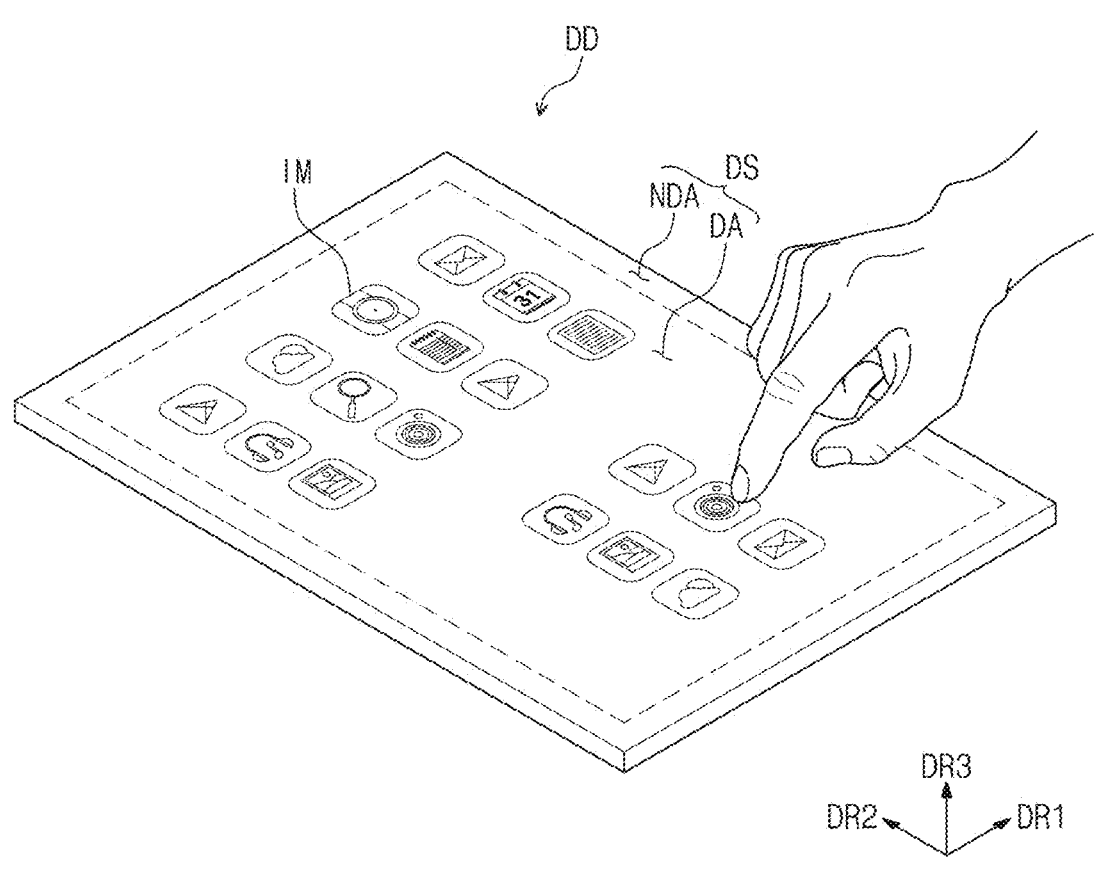
FIG. 1 is a perspective view of a display device according to an embodiment of the inventive concept.

In this specification, when an element (or region, layer, part, etc.) is referred to as being "on", "connected to", or "coupled to" another element, it may mean that it may be directly placed on/connected to/coupled to other components, or a third component may be arranged between them.

Like reference numerals may refer to like elements throughout the specification and the drawings. While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

It will be understood that the terms "first" and "second" are used herein to describe various components but these components should not necessarily be limited by these terms. The above terms may be used to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" may be used to describe a relationship of components shown in the drawing. The terms may be described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described with reference to the drawings.

Figure 2:
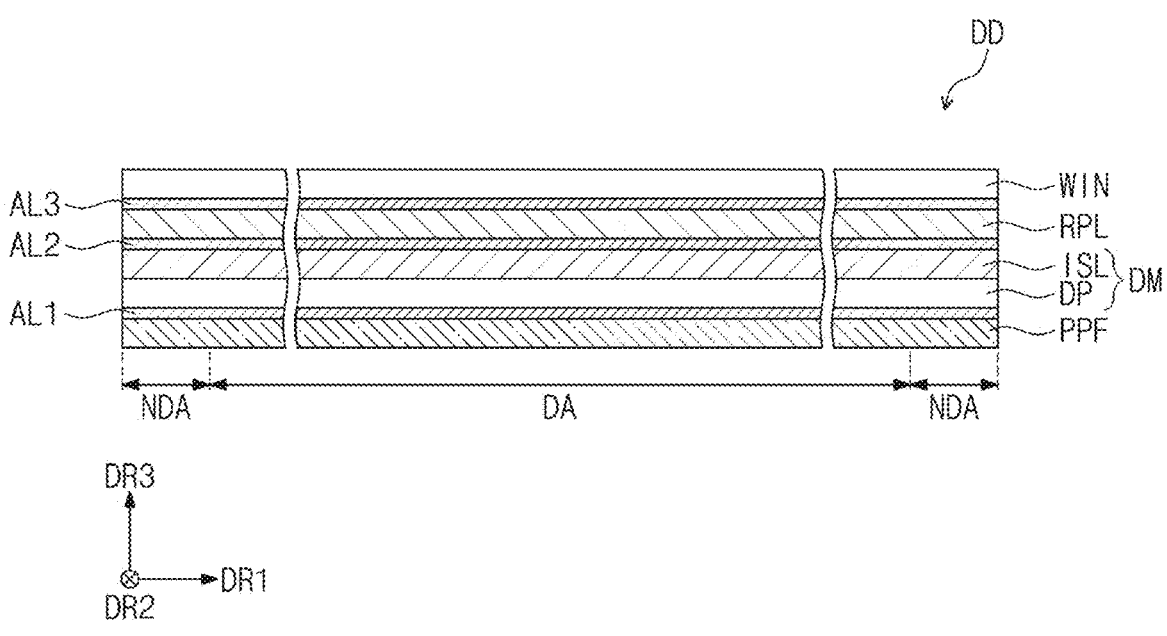
FIG. 2 is a cross-sectional view of a display device according to an embodiment of the inventive concept.
Figure 3:
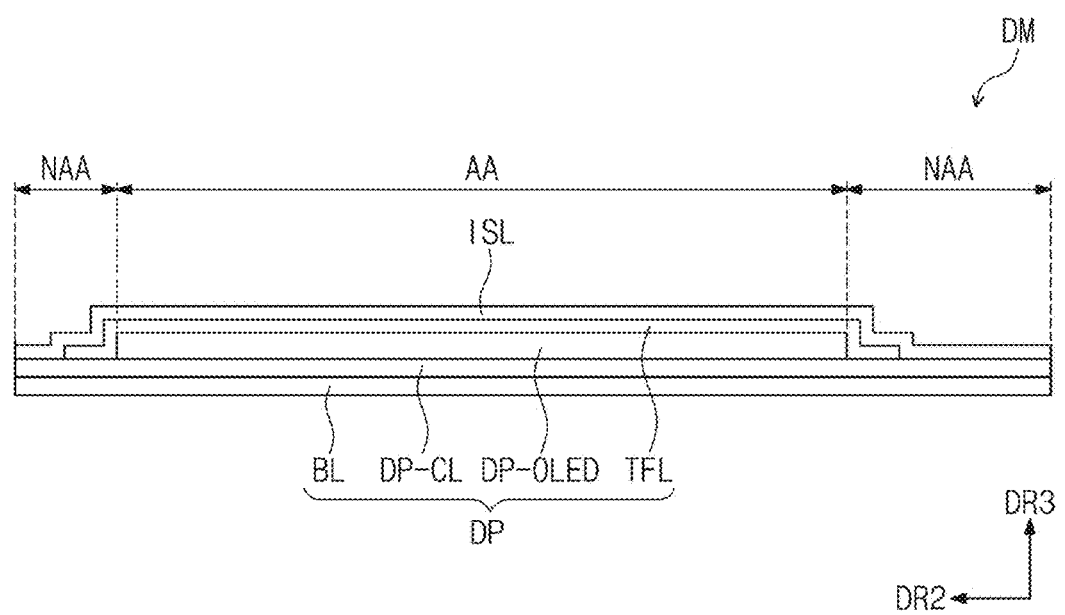
FIG. 3 is a cross-sectional view of a display module according to an embodiment of the inventive concept.

FIG. 1 is a perspective view of a display device according to an embodiment of the inventive concept. FIG. 2 is a cross-sectional view of a display device according to an embodiment of the inventive concept. FIG. 3 is a cross-sectional view of a display module according to an embodiment of the inventive concept.

Referring to FIG. 1, a display device DD, according to an embodiment of the inventive concept, may have a substantially rectangular shape with a pair of long sides extending in a first direction DR1 and a pair of short sides extending in a second direction DR2 intersecting the first direction DR1. However, the inventive concept is not necessarily limited thereto, and the display device DD may have various shapes such as a circle or a polygon.

Hereinafter, the direction substantially perpendicular to the plane defined by the first direction DR1 and the second direction DR2 is defined as the third direction DR3. In addition, in this specification, the meaning of "when viewed in a plan view" is defined as a state viewed in the third direction DR3.

The upper surface of the display device DD may be defined as the display surface DS and may have a plane defined by the first direction DR1 and the second direction DR2. The images IM generated by the display device DD may be provided to the user through the display surface DS.

The display surface DS may include a display area DA and a non-display area NDA proximate to the display area DA. The display area DA may display an image, and the non-display area NDA might not display an image. The non-display area NDA may at least partially surround the display area DA and may define an outline portion of the display device DD printed in a predetermined color.

The display device DD may be used in large electronic devices such as a television, a monitor, or an external advertisement board. In addition, the display device DD may be used in small and medium-sized electronic devices such as a personal computer, a notebook computer, a personal digital terminal, a car navigation system, a game machine, a smart phone, a tablet, or a camera. However, these are presented only as embodiments, and may be used in other electronic devices without departing from the concept of the inventive concept.

FIG. 2 is a view showing a cross section of the display device DD shown in FIG. 1 as an example. FIG. 3 is a view showing a cross section of the display module DM shown in FIG. 2 as an example.

Referring to FIGS. 2 and 3, the display device DD may include a display module DM, an antireflection layer RPL, a window WIN, a panel protection film PPF, and first to third adhesive layers AL1 to AL3. The display module DM may display an image IM (see FIG. 1) and detect an external input, such as a touch of a user. The display module DM may include a display panel DP and an input sensor ISL.

The display panel DP may generate an image IM (see FIG. 1). The display panel DP may be a light emitting display panel, and might not be particularly limited thereto. For example, the display panel DP may be an organic light emitting display panel or a quantum dot light emitting display panel. In the organic light emitting display panel, the light emitting layer may include an organic light emitting material. The light emitting layer of the quantum dot light emitting display panel may include quantum dot, quantum rod, and the like. Hereinafter, the display panel DP is described as the organic light emitting display panel.

In one embodiment, the display panel DP may be a flexible display panel. For example, the display panel DP may include a plurality of electronic elements disposed on the flexible substrate.

In this embodiment, the display panel DP may include a base layer BL, a circuit element layer DP-CL disposed on the base layer BL, a display element layer DP-OLED disposed on the circuit element layer DP-CL, and a thin film encapsulation layer TFE disposed on the display element layer DP-OLED.

The base layer BL may include an active area AA and a peripheral area NAA proximate to the active area AA. A display element layer DP-OLED may be disposed on the active area AA. The base layer BL may include a flexible plastic material such as polyimide (PI).

A plurality of pixels may be disposed on the circuit element layer DP-CL and the display element layer DP-OLED. Each of the pixels may include a transistor disposed on the circuit element layer DP-CL and a light emitting element disposed on the display element layer DP-OLED and electrically connected to the transistor. The configuration of the pixel will be described in detail below.

A thin film encapsulation layer TFE may at least partially cover the display element layer DP-OLED. The thin film encapsulation layer TFE may include sequentially stacked inorganic layers, organic layers, and inorganic layers. The inorganic layers may include an inorganic material and may protect the pixels from moisture/oxygen. The organic layer may include an organic material and may protect the pixels from foreign substances such as dust particles.

The input sensor ISL may be disposed on the display panel DP. The input sensor ISL may sense an external input. The external input may include various types of inputs provided from beyond the display device DD (see FIG. 1). The external input may be provided in various forms. For example, the external input may include an external input (e.g., hovering) that is applied close to or spaced a predetermined distance from the display device DD as well as contact by a portion of the body, such as the user's hand. Further, it may have various forms such as force, pressure, and light, and is not necessarily limited to any one embodiment. The input sensor ISL may include a plurality of sensor units for sensing an external input in a capacitive manner.

The input sensor ISL may be directly manufactured on the display panel DP when the display panel DP is manufactured. Accordingly, the input sensor ISL may be disposed on the thin film encapsulation layer TFE, and the input sensor ISL may be formed on the thin film encapsulation layer TFE through a continuous process. However, the embodiment of the inventive concept is not necessarily limited thereto, and the input sensor ISL may be manufactured as a separate panel from the display panel DP and attached to the display panel DP, for example, by an adhesive layer.

An antireflection layer RPL may be disposed on the input sensor ISL. The antireflection layer RPL may reduce reflectance of external light incident on the display panel DP from above the display device DD. For example, the antireflection layer RPL may include a phase retarder and/or a polarizer.

The window WIN may be disposed on the antireflection layer RPL. The window WIN may protect the display module DM and the antireflection layer RPL from external scratches and shocks.

A panel protection film PPF may be disposed under the display panel DP. A panel protection film PPF may protect a lower portion of the display panel DP. The panel protection film PPF may include a flexible plastic material such as polyethylene terephthalate (PET).

The first adhesive layer AL1 may be disposed between the display panel DP and the panel protection film PPF to adhere the display panel DP and the panel protection film PPF to each other. The second adhesive layer AL2 may be disposed between the antireflection layer RPL and the input sensor ISL to adhere the antireflection layer RPL and the input sensor ISL to each other. The third adhesive layer AL3 may be disposed between the window WIN and the antireflection layer RPL to adhere the window WIN and the antireflection layer RPL to each other.

Figure 4A:
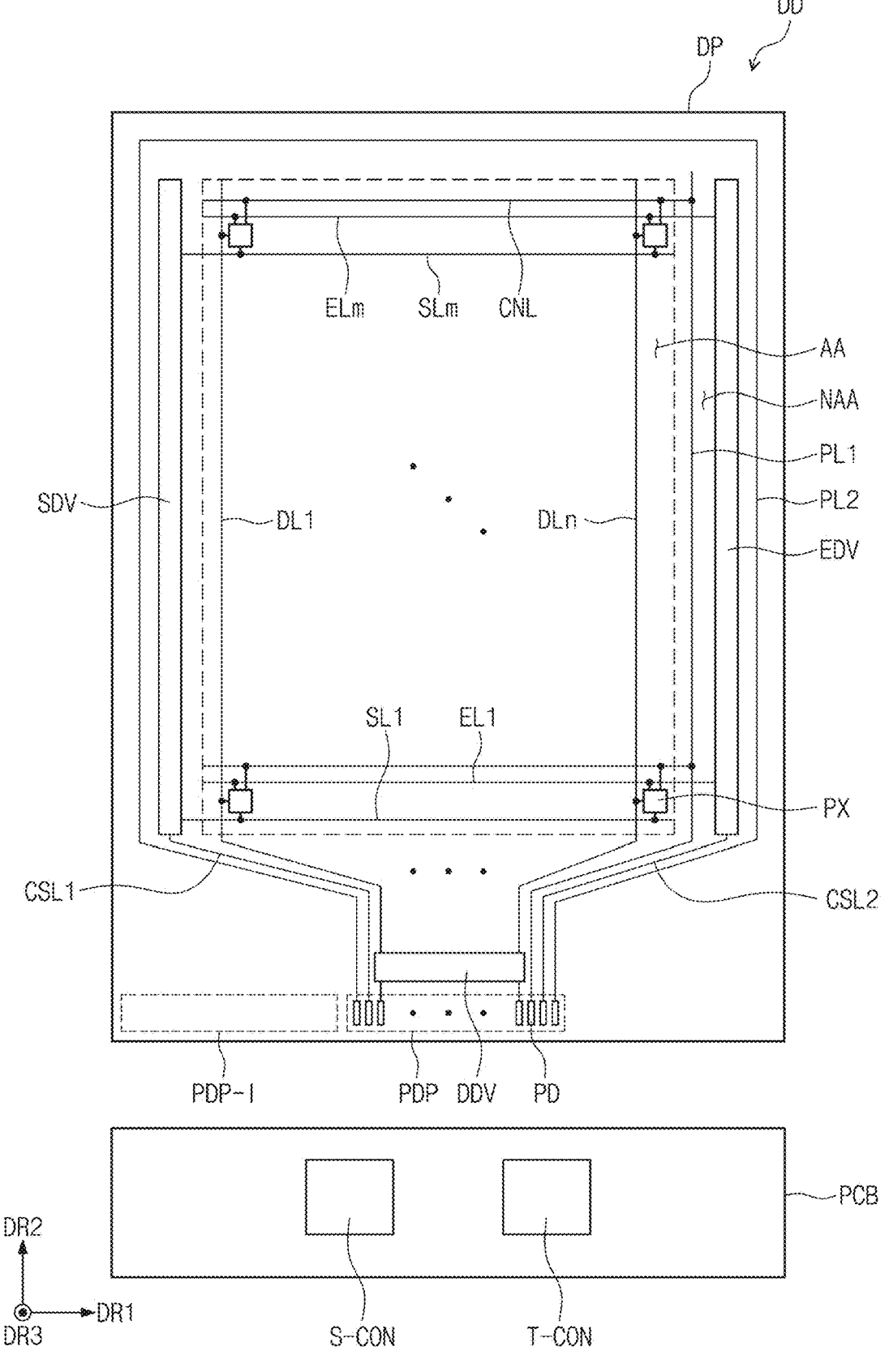
FIG. 4A is a plan view of components of a display device according to an embodiment of the inventive concept.
Figure 4B:
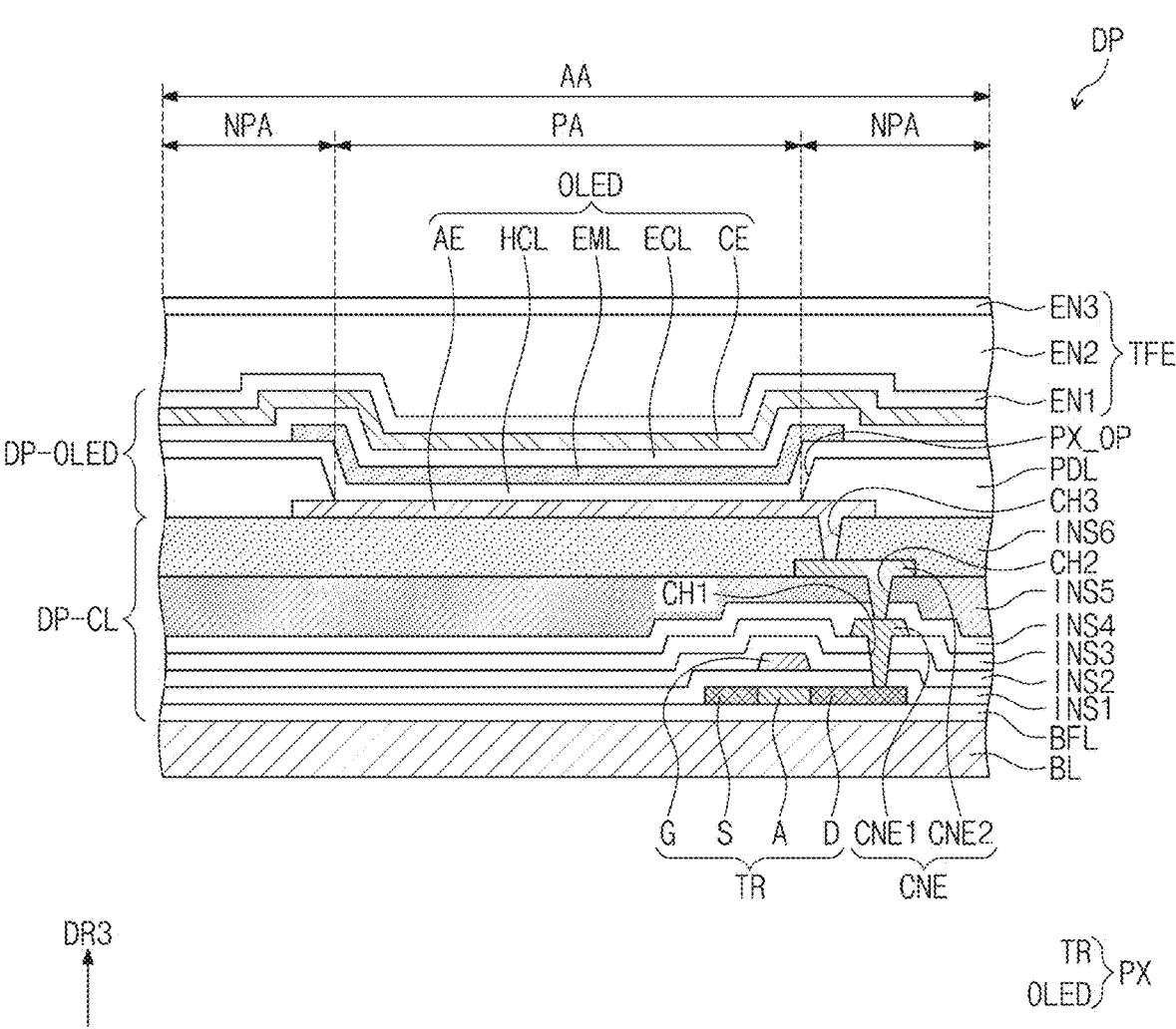
FIG. 4B is an enlarged cross-sectional view of a partial area of a display panel according to an embodiment of the inventive concept.

FIG. 4A is a plan view of components of a display device according to an embodiment of the inventive concept. FIG. 4B is an enlarged cross-sectional view of a partial area of a display panel according to an embodiment of the inventive concept.

Referring to FIG. 4A, the display device DD may include a display panel DP, a scan driver SDV, a data driver DDV, an emission driver EDV, a circuit board PCB, a timing controller T-CON, and a detection control unit S-CON.

The display panel DP may have a rectangular shape having a pair of short sides extending in the first direction DR1 and a pair of long sides extending in the second direction DR2. The display panel DP may be divided into an active area AA and a peripheral area NAA adjacent to the active area AA. In one embodiment, the peripheral area NAA may at least partially surround the active area AA. The active area AA and peripheral area NAA of the display panel DP may correspond to the display area DA and non-display area NDA of the display device DD described above with reference to FIG. 1, respectively.

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, first and second power lines PL1 and PL2, connection lines CNL, and a display pad part PDP. Here M and n are positive integers.

The pixels PX may be disposed in the active area AA. The scan driver SDV and the emission driver EDV may be disposed in the peripheral area NAA respectively adjacent to the long sides of the display panel DP. The data driver DDV may be disposed in the peripheral area NAA adjacent to one of the short sides of the display panel DP. In a plan view, the data driver DDV may be adjacent to the lower end of the display panel DP. The data driver DDV may be manufactured in the form of an integrated circuit chip and mounted on the display panel DP.

The scan lines SL1 to SLm may extend in the second direction DR2 and may be electrically connected to the pixels PX and the scan driver SDV. The data lines DL1 to DLn may extend in the second direction DR2 and be electrically connected to the pixels PX and the data driver DDV. The emission lines EL1 to Elm may extend in the first direction DR1 and be electrically connected to the pixels PX and the emission driver EDV.

The first power line PL1 may extend in the second direction DR2 and be disposed in the peripheral area NAA. The first power line PL1 may be disposed between the active area AA and the emission driver EDV, but is not necessarily limited thereto, and the first power line PL1 may be disposed between the active area AA and the scan driver SDV.

The connection lines CNL may extend in a first direction DR1 and may be arranged in a second direction DR2. The connection lines CNL may be electrically connected to the first power line PL1 and the pixels PX. A first voltage may be applied to the pixels PX through the first power line PL1 and the connection lines CNL electrically connected to each other.

The second power line PL2 may be disposed in the peripheral area NAA. The second power line PL2 may extend along long sides of the display panel DP and along the other short side of the display panel DP on which the data driver DDV is not disposed. The second power line PL2 may be disposed beyond the scan driver SDV and the emission driver EDV.

The second power line PL2 may extend toward the active area AA and be electrically connected to the pixels PX. A second voltage having a lower level than the first voltage may be applied to the pixels PX through the second power line PL2.

The first control line CSL1 is electrically connected to the scan driver SDV and may extend toward the lower end of the display panel DP in a plan view. The second control line CSL2 is electrically connected to the emission driver EDV and may extend toward the lower end of the display panel DP in a plan view. The data driver DDV may be disposed between the first control line CSL1 and the second control line CSL2.

A display pad part PDP may be disposed in a peripheral area NAA adjacent to a lower end of the display panel DP. In one embodiment, the display pad part PDP may be disposed in a central portion of the peripheral area NAA adjacent to the bottom of the display panel DP.

The display pad part PDP may include display pads PD. The data driver DDV, the first power line PL1, the second power line PL2, the first control line CSL1, and the second control line CSL2 may be electrically connected to the display pads PD. The data lines DL1 to DLn may be electrically connected to the data driver DDV, and the data driver DDV may be electrically connected to the display pads PD corresponding to the data lines DL1 to DLn.

The circuit board PCB may be electrically connected to the display pads PD. The timing controller T-CON and the detection control unit S-CON may be manufactured as integrated circuit chips and mounted on a circuit board PCB. The timing controller T-CON may be electrically connected to the data driver DDV and the display pads PD may be electrically connected to the first and second control lines CSL1 and CSL2 through the circuit board PCB.

A voltage generator for generating first and second voltages may be disposed on a circuit board PCB, and the voltage generator may be electrically connected to display pads PD that are electrically connected to first and second power lines PL1 and PL2.

The timing controller T-CON may generate a scan control signal, a data control signal, and an emission control signal. The scan control signal may be provided to the scan driver SDV through the first control line CSL1. The emission control signal may be provided to the emission driver EDV through the second control line CSL2. The data control signal may be provided to a data driver DDV. The timing controller T-CON may provide image signals to the data driver DDV.

The scan driver SDV may generate a plurality of scan signals in response to the scan control signal, and the scan signals may be applied to the pixels PX through the scan lines SL1 to SLm.

The data driver DDV may generate a plurality of data voltages corresponding to the image signals in response to the data control signal. The data voltages may be applied to the pixels PX through the data lines DL1 to DLn.

The emission driver EDV may generate a plurality of emission signals in response to the emission control signal, and the emission signals may be applied to the pixels PX through the emission lines EL1 to Elm.

The pixels PX may be provided with the data voltages in response to the scan signals. The pixels PX may display an image by emitting light having luminance corresponding to data voltages in response to emission signals. The emission time of the pixels PX may be controlled by emission signals.

In FIG. 4A, an input pad part PDP-I disposed on an input sensor ISL (see FIG. 2) is shown together, and the input pad part PDP-I may be an area where input pads to which detection wires are connected, which will be described below, are disposed. In this embodiment, the input pad part PDP-I may be spaced apart from the display pad part PDP on one side on a plane.

The detection control unit S-CON may be electrically connected to input pads of an input sensor ISL (see FIG. 2) to be described below through a circuit board PCB. The detection control unit S-CON may provide signals for driving the input sensor ISL (see FIG. 2) to the input sensor ISL (see FIG. 2). A detailed description of the input pad part PDP-I and input pads will be described later.

FIG. 4B is an enlarged cross-sectional view of a partial area of a display panel according to an embodiment of the inventive concept. FIG. 4B is a view showing an exemplary cross-section of a display panel in which one pixel PX shown in FIG. 4A is disposed.

Referring to FIG. 4B, the pixel PX may include a transistor TR and a light emitting element OLED. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the base layer BL. For example, one transistor TR is illustrated, but the pixel PX may include a plurality of transistors and at least one capacitor for driving the light emitting element OLED.

The active area AA may include an emission area PA corresponding to each of the pixels PX and a non-emission area NPA adjacent to the emission area PA. The light emitting element OLED may be disposed in the emission area PA.

A buffer layer BFL is disposed on the base layer BL, and the buffer layer BFL may be an inorganic layer. A semiconductor pattern may be disposed on the buffer layer BFL. The semiconductor pattern may include polysilicon. However, the embodiment of the inventive concept is not necessarily limited thereto, and the semiconductor pattern may include amorphous silicon or metal oxide.

The semiconductor pattern may be doped with an N-type dopant or a P-type dopant. The semiconductor pattern may include a high doping area and a low doping area. The conductivity of the high doping area is greater than that of the low doping area, and may substantially serve as a source electrode and a drain electrode of the transistor TR. The low doping area may substantially correspond to the active channel (or channel) of the transistor.

The source S, active channel A, and drain D of the transistor TR may be formed from a semiconductor pattern. The first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

The connection electrodes CNE are disposed between the transistor TR and the light emitting element OLED to connect the transistor TR and the light emitting element OLED. The connection electrodes CNE may include a first connection electrode CNE1 and a second connection electrode CNE2.

The first connection electrode CNE1 may be disposed on the third insulating layer INS3, and may be electrically connected to the drain D through the first contact hole CH1 defined in the first to third insulating layers INS1 to INS3. A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be electrically connected to the first connection electrode CNE1 through the second contact hole CH2 defined in the fourth and fifth insulating layers INS4 and INS5.

A sixth insulating layer INS6 may be disposed on the second connection electrode CNE2. A layer from the buffer layer BFL to the sixth insulating layer INS6 may be defined as a circuit element layer DP-CL. The first to sixth insulating layers INS1 to INS6 may be inorganic layers or organic layers.

The first electrode AE may be disposed on the sixth insulating layer INS6. The first electrode AE may be electrically connected to the second connection electrode CNE2 through the third contact hole CH3 defined in the sixth insulating layer INS6. A pixel defining film PDL exposing a predetermined portion of the first electrode AE may be disposed on the first electrode AE and the sixth insulating layer INS6. In the pixel defining film PDL, an opening part PX_OP for exposing a predetermined portion of the first electrode AE may be defined.

The hole control layer HCL may be disposed on the first electrode AE and the pixel defining film PDL. The hole control layer HCL may be commonly disposed in the emission area PA and the non-emission area NPA. The hole control layer HCL may include a hole transport layer and a hole injection layer.

The light emitting layer EML may be disposed on the hole control layer HCL. The light emitting layer EML may be disposed in an area corresponding to the opening part PX_OP. The light emitting layer EML may include an organic material and/or an inorganic material. The light emitting layer EML may generate red, green, or blue light.

The electronic control layer ECL may be disposed on the light emitting layer EML and the hole control layer HCL. The electron control layer ECL may be commonly disposed in the emission area PA and the non-emission area NPA. The electron control layer ECL may include an electron transport layer and an electron injection layer.

The second electrode CE may be disposed on the electron control layer ECL. The second electrode CE may be commonly disposed on the pixels PX. A layer on which a light emitting element OLED is disposed may be defined as a display element layer DP-OLED.

A thin film encapsulation layer TFE may be disposed on the second electrode CE to at least partially cover the light emitting element OLED. Thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may be inorganic layers, and the second encapsulation layer EN2 may be an organic layer. The first and third encapsulation layers EN1 and EN3 may protect the light emitting element OLED from moisture/oxygen. The second encapsulation layer EN2 may protect the light emitting element OLED from foreign substances such as dust particles.

A first voltage may be applied to the first electrode AE through the transistor TR, and a second voltage may be applied to the second electrode CE. The holes and electrons injected into the light emitting layer EML are combined to form excitons, and as the excitons transition to the ground state, the organic light emitting diode OLED may emit light.

Figure 5:
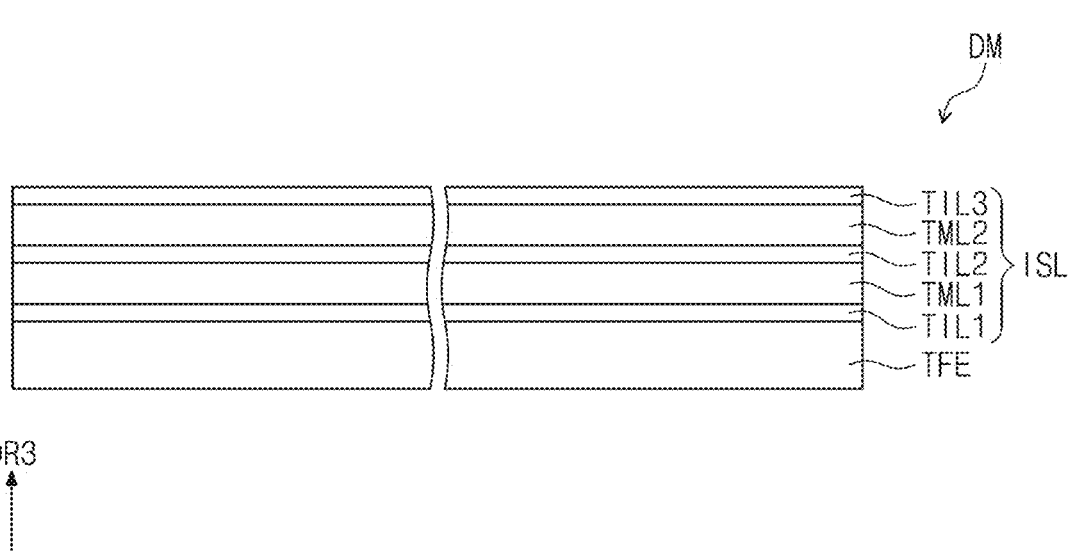
FIG. 5 is an enlarged cross-sectional view of components of a display module according to an embodiment of the inventive concept.
Figure 6:
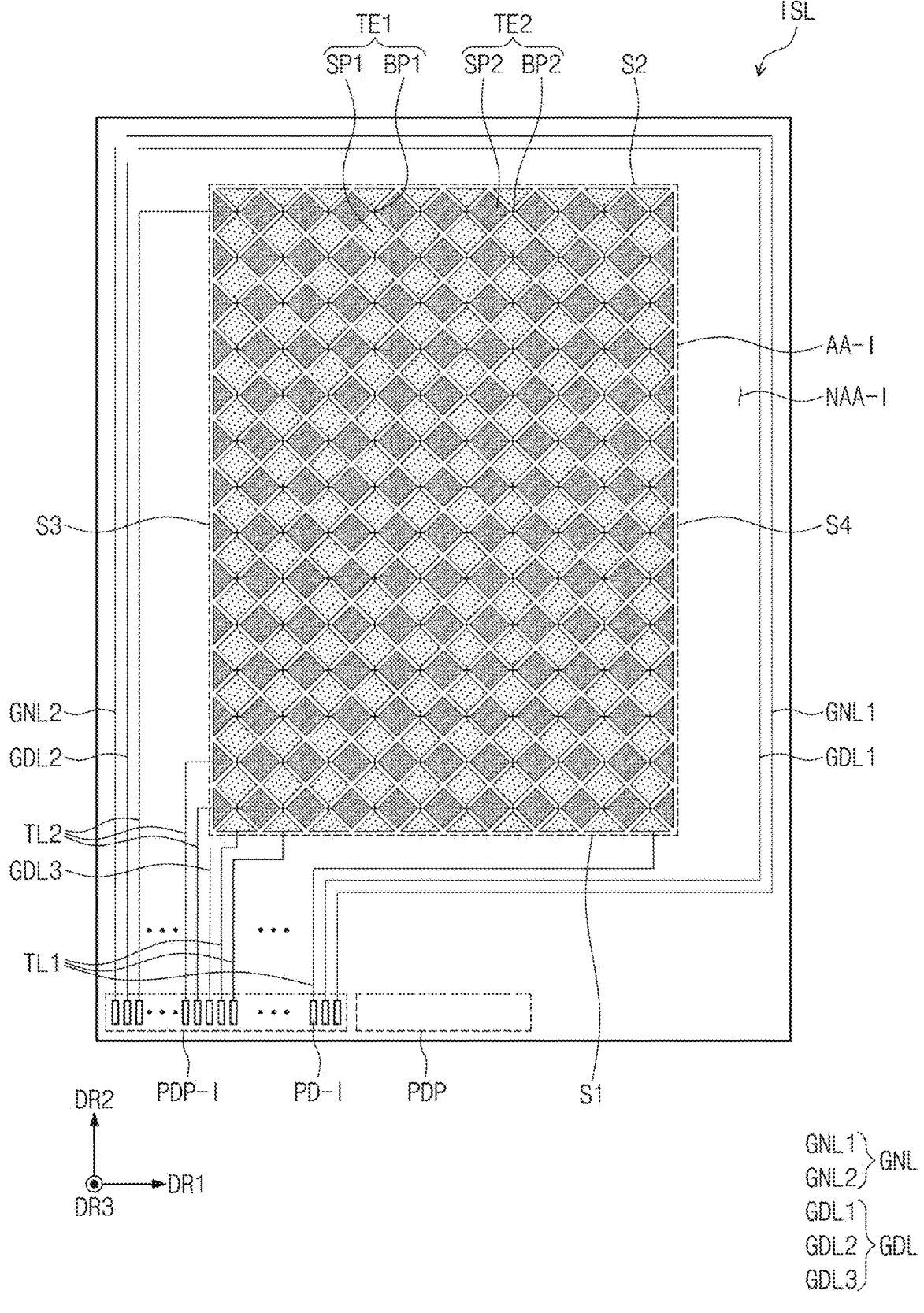
FIG. 6 is a plan view of an input sensor according to an embodiment of the inventive concept.

FIG. 5 is an enlarged cross-sectional view of components of a display module according to an embodiment of the inventive concept. FIG. 6 is a plan view of an input sensor according to an embodiment of the inventive concept. The same/similar reference numerals may be used for the same/ similar configurations as those described in FIGS. 2 to 4B, and to the extent that descriptions of elements are omitted, it may be understood that these elements are at least similar to corresponding elements that have been described elsewhere within the present disclosure.

Referring to FIG. 5, the input sensor ISL may be disposed on the thin film encapsulation layer TFE. The input sensor ISL may include a first detection insulating layer TIL1, a first detection conductive layer TML1, a second detection insulating layer TIL2, a second detection conductive layer TML2, and a third detection insulating layer TIL3.

The first detection insulating layer TIL1 may be directly disposed on the thin film encapsulation layer TFE. According to an embodiment of the input sensor ISL, the first detection insulating layer TIL1 may be omitted.

Each of the first detection conductive layer TML1 and the second detection conductive layer TML2 may have a single-layer structure or a multi-layer structure. The conductive layer of the multilayer structure may be composed of a transparent conductive layer and/or a metal layer. The multi-layered conductive layer may include metal layers, for example, including different metals.

Each of the first and second detection conductive layers TML1 and TML2 may include indium tin oxide (ITO), indium zinc oxide (IZO), zinc oxide (ZnO), indium tin zinc oxide (ITZO), PEDOT, metal nanowires, and/or graphene as a transparent conductive layer. Each of the first and second detection conductive layers TML1 and TML2 may include molybdenum, silver, titanium, copper, aluminum, and/or an alloy thereof as a metal layer.

For example, each of the first and second detection conductive layers TML1 and TML2 may have a three-layer structure composed of titanium/aluminum/titanium. A metal having relatively high durability and low reflectance may be applied to the outer layer of the conductive layer, and a metal having high electrical conductivity may be applied to the inner layer of the conductive layer.

Each of the first to third detection insulating layers TIL1, TIL2, and TIL3 may include an inorganic film or an organic film. In one embodiment, each of the first and second detection conductive layers TML1 and TML2 may include an inorganic film. The inorganic layer may include aluminum oxide, titanium oxide, silicon oxide silicon oxynitride, zirconium oxide, and/or hafnium oxide. The third detection insulating layer TIL3 may include an organic film. The organic film may include acrylic resin, methacrylic resin, polyisoprene, vinyl resin, epoxy resin, urethane resin, cellulose resin, siloxane resin, polyimide resin, polyamide resin, and/or perylene resin.

Referring to FIG. 6, the input sensor ISL may include detection electrodes TE1 and TE2, detection wires TL1 and TL2 respectively electrically connected to the detection electrodes TE1 and TE2, at least one input pad part PDP-I, at least one ground line GNL, and at least one guard wire GDL.

The input sensor ISL may have a rectangular shape having a pair of short sides extending in the first direction DR1 and a pair of long sides extending in the second direction DR2. The input sensor ISL may be divided into an active area AA-I and a peripheral area NAA-I adjacent to the active area AA-I. The active area AA-I and the peripheral area NAA-I of the input sensor ISL may correspond to the active area AA and peripheral area NAA of the display panel DP described above with reference to FIG. 4A, respectively.

The detection electrodes TE1 and TE2 may be disposed in the active area AA-I. The detection electrodes TE1 and TE2 may include first detection electrodes TE1 and second detection electrodes TE2.

Each of the first detection electrodes TE1 extends in the second direction DR2, and the first detection electrodes TE1 may be arranged along the first direction DR1.

Each of the first detection electrodes TE1 may include first detection patterns SP1 and at least one first conductive pattern BP1. The first detection patterns SP1 may be arranged along the first direction DR1. At least one first conductive pattern BP1 may be electrically connected to two adjacent first detection patterns SP1.

Each of the second detection electrodes TE2 extends in the first direction DR1, and the second detection electrodes TE2 may be arranged along the first direction DR1.

The second detection electrodes TE2 may include second detection patterns SP2 and at least one second conductive pattern BP2. The second detection patterns SP2 may be arranged along the second direction DR2. At least one second conductive pattern BP2 may be disposed between two adjacent second detection patterns SP2. According to an embodiment, the second detection patterns SP2 and the second conductive patterns BP2 may be integrally shaped patterns patterned by the same process.

According to an embodiment, the first conductive pattern BP1 may be included in the first detection conductive layer TML1 described with reference to FIG. 5, and the first detection patterns SP1, the second detection patterns SP2, and the second conductive pattern BP2 may be included in the second detection conductive layer TML2 described with reference to FIG. 5.

An input pad part PDP-I may be disposed in a peripheral area NAA-I adjacent to a lower end of the input sensor ISL. The input pad part PDP-I may include a plurality of input pads PD-I. The input pads PD-I may be electrically connected to the aforementioned circuit board PCB (see FIG. 4A). The aforementioned detection control unit S-CON (see FIG. 4A) may be electrically connected to the input pads PD-I through the circuit board PCB (see FIG. 4A).

For convenience of description, FIG. 6 shows the display pad part PDP of the display panel DP (see FIG. 4A). In this embodiment, the input pad part PDP-I may be spaced apart from the display pad part PDP in a direction opposite to the first direction DR1 on a plane, and the input pad part PDP-I may be disposed adjacent to the left end of the input sensor ISL. However, the embodiment of the inventive concept is not necessarily limited to this, and the Input pad part PDP-I may be spaced apart from the display pad part PDP (see FIG. 4A) in the first direction DR1 and may be disposed adjacent to the right end of the input sensor ISL.

In an embodiment of the inventive concept, the input pads PD-I may be disposed on the display panel DP (see FIG. 4A). For example, the detection wires TL1 and TL2 are electrically connected to separate wires arranged on the display panel DP (see FIG. 4A) through a contact hole penetrating the first and second detection insulating layers TIL1 and TIL2 (see FIG. 5) and insulating layers in the display panel DP (see FIG. 4A), and may be electrically connected to the input pads PD-I disposed on the display panel DP (see FIG. 4A) through wires electrically connected from the display panel DP (see FIG. 4A).

The detection wires TL1 and TL2 may be disposed in the peripheral area NAA-I. The detection wires TL1 and TL2 may include first detection wires TL1 and second detection wires TL2.

In this embodiment, each of the first detection wires TL1 may be electrically connected to one end of a corresponding first detection electrode TE1 among the first detection electrodes TE1. Each of the first detection wires TL1 may be electrically connected to an end adjacent to the input pad part PDP-I among both ends of the corresponding first detection electrode TE1.

In this embodiment, each of the second detection wires TL2 may be electrically connected to one end of a corresponding second detection electrode TE2 among the second detection electrodes TE2. FIG. 6 exemplarily shows that each of the second detection wires TL2 is electrically connected to the left end among both ends of the corresponding second detection electrode TE2. However, the embodiment of the inventive concept is not necessarily limited to this, and when the input pad part PDP-I is placed adjacent to the right end of the input sensor ISL, each of the second detection wires TL2 may be electrically connected to the right end of the corresponding second detection electrode TE2.

In one embodiment, the second detection electrodes TE2 may be defined as input detection electrodes, and the first detection electrodes TE1 may be defined as output detection electrodes. The input sensor ISL may be driven in a mutual detection mode. For example, driving signals may be applied to the second detection electrodes TE2 through the second detection wires TL2, and sensing signals may be output from the first detection electrodes TE1 through the first detection wires TL1. The aforementioned detection control unit may output driving signals and receive sensing signals.

However, the embodiment of the inventive concept is not necessarily limited to this, and the first detection electrodes TE1 are defined as input detection electrodes, and the second detection electrodes TE2 are defined as output detection electrodes, such that drive signals may be applied to the first detection electrodes TE1 through the first detection wires TL1, and sensing signals may be output from the second detection electrodes TE2 through the second detection wires TL2.

The other end of each of the first detection wires TL1 may be electrically connected to a corresponding input pad PD-I among the input pads PD-I. The other end of each of the second detection wires TL2 may be electrically connected to a corresponding input pad PD-I among the input pads PD-I. For example, each of the first detection wires TL1 may extend from one end of the corresponding first detection electrode TE1 to the corresponding input pad PD-I, and each of the second detection wires TL2 may extend from one end of the corresponding second detection electrode TE2 to the corresponding input pad PD-I.

In one embodiment, the lengths of the first detection wires TL1 may increase in the first direction DR1. However, the embodiment of the inventive concept is not necessarily limited thereto, and among the first detection wires TL1, the first detection wire disposed inside the leftmost first detection wire may have the shortest length.

In one embodiment, the length of the second detection wires TL2 may be increased as the connected $2^{nd}$ detection electrode TE2 gets farther from the input pad part PDP-I (or the circuit board PCB (see FIG. 4A)).

According to the inventive concept, resistance values of the first detection wires TL1 may be set by controlling the length and/or width of each of the first detection wires TL1. Similarly, resistance values of the second detection wires TL2 may be set by controlling the length and/or width of each of the second detection wires TL2. Through this, deviation of noise generated in the first and second detection electrodes TE1 and TE2 may be reduced. A detailed description of this will be described later.

In this embodiment, the input sensor ISL may further include at least one ground wire GNL and at least one guard wire GDL.

At least one ground wire GNL may be disposed in the peripheral area NAA-I. The ground wire GNL may be disposed beyond the first and second detection wires TL1 and TL2. A ground wire GNL may be placed on the outermost side. The ground wire GNL may be electrically connected to a corresponding input pad PD-I. The ground wire GNL may be electrically connected to the ground terminal of the display device DD (see FIG. 1) through the input pad PD-I. Through this, external static electricity applied to the input sensor ISL may be discharged to the ground terminal through the ground wire GNL. Accordingly, the input sensor ISL may be protected from external static electricity by the ground wire GNL.

In this embodiment, the active area AA-I may include a first side S1, a second side S2, a third side S3, and a fourth side S4 connected to each other to form a quadrangular shape. The first side S1 and the second side S2 may extend in the first direction DR1 and face each other in the second direction DR2. The first side S1 may correspond to the lower side based on the detection electrodes TE1 and TE2, and the second side S2 may correspond to the upper side based on the detection electrodes TE1 and TE2. The third side S3 and the fourth side S4 may extend in the second direction DR2 and face each other in the first direction DR1. The third side S3 may correspond to the left side based on the detection electrodes TE1 and TE2, and the fourth side S4 may correspond to the right side based on the detection electrodes TE1 and TE2. The description of the first to fourth sides S1, S2, S3, and S4 may be equally applied to the active area AA (see FIG. 4A) of the display panel DP (see FIG. 4A).

In this embodiment, at least one ground wire GNL may include a first ground wire GNL1 and a second ground wire GNL2. The first ground wire GNL1 may extend from a corresponding input pad PD-I of the input pads PD-I along the first, fourth, and second sides S1, S4, and S2. The second ground wire GNL2 may extend from the corresponding input pad PD-I along the third side. The first and second ground wires GNL1 and GNL2 may be electrically connected to the outermost input pads PD-I among the input pads PD-I.

At least one guard wire GDL may be disposed in a peripheral area NAA. The guard wire GDL may be disposed beyond the first and second detection wires TL1 and TL2 and inside the ground wire GNL. The guard wire GDL may be electrically connected to a corresponding input pad PD-I. The guard wire GDL may be electrically connected to the detection control unit S-CON (see FIG. 4A). The detection control unit S-CON (see FIG. 4A) may apply a signal having a predetermined level to the guard wire GDL through the input pads PD-I.

Due to the potential difference between the ground wire GNL and the first and second detection wires TL1 and TL2, a coupling phenomenon may occur between the ground wire GNL and the first and second detection wires TL1 and TL2. For example, noise may occur due to mutual signal interference. To reduce this phenomenon, a signal having a predetermined level may be applied to the guard wire GDL. The guard wire GDL is disposed between the ground wire GNL and the first and second detection wires TL1 and TL2, such that a coupling phenomenon between the ground wire GNL and the first and second detection wires TL1 and TL2 may be reduced.

In this embodiment, at least one guard wire may include a first guard wire GDL1, a second guard wire GDL2, and a third guard wire GDL3.

The first guard wire GDL1 may extend from a corresponding input pad PD-I among the input pads PD-I along the first, fourth and second sides S1, S4 and S2 of the active area AA-I. The first guard wire GDL1 is disposed between the first, fourth, and second sides S1, S4, and S2 of the active area AA-I and the first ground wire GNL1, and the first guard wire GDL1 may extend along the extension direction of the first ground wire GNL1.

The second guard wire GDL2 may extend along the second side S2 from the corresponding input pad PD-I. The second guard wire GDL2 may extend along the extension direction of the second ground wire GNL2. The first and second ground wires GNL1 and GNL2 may be respectively electrically connected to the outermost input pads PD-I among the input pads PD-I.

The third guard wire GDL3 may be disposed between the first and second detection wires adjacent to each other among the first detection wires TL1 and the second detection wires TL2.

Figure 7A:
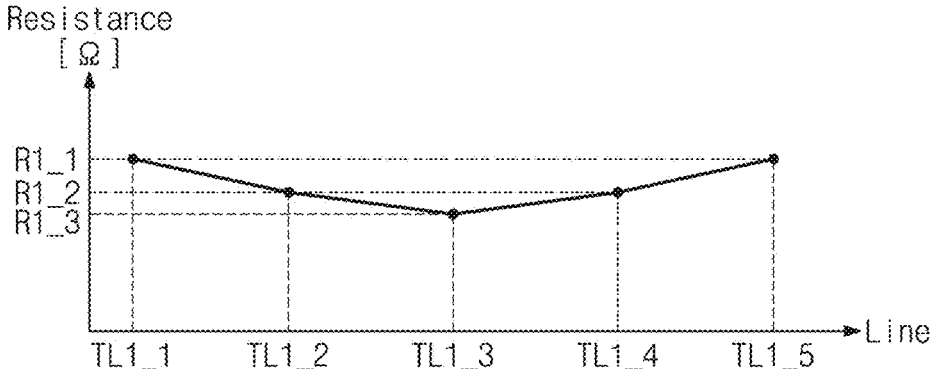
FIG. 7A is a graph showing resistance values of first detection wires according to an embodiment of the inventive concept.
Figure 7B:
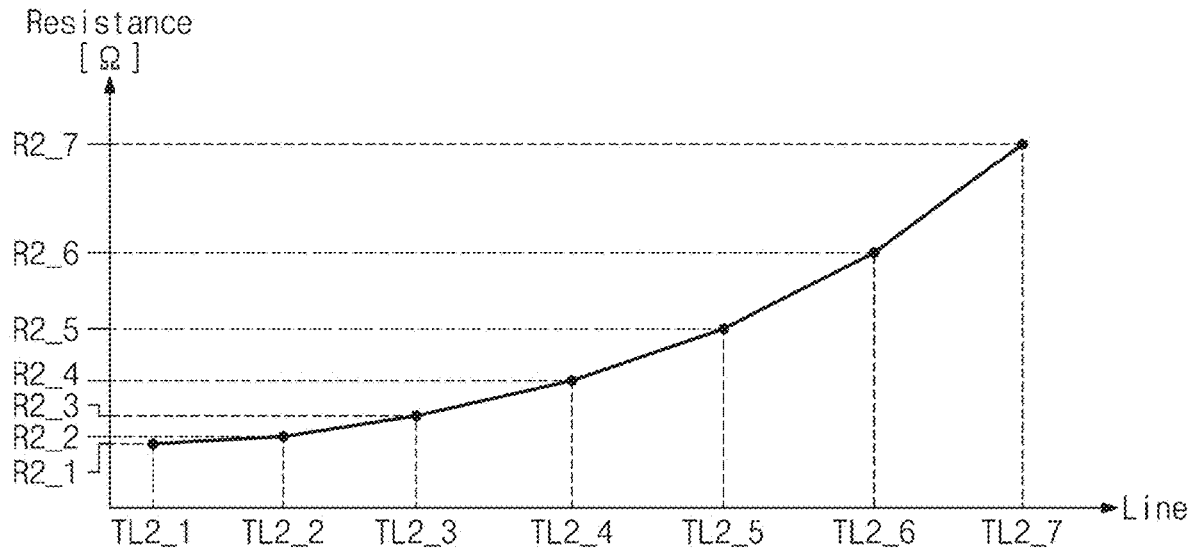
FIG. 7B is a graph showing resistance values of second detection wires according to an embodiment of the inventive concept.

FIG. 7A is a graph showing resistance values of first detection wires according to an embodiment of the inventive concept. FIG. 7B is a graph showing resistance values of second detection wires according to an embodiment of the inventive concept. FIG. 7A exemplarily shows the resistance value of each of the five first detection wires TL1 (see FIG. 6), and FIG. 7B exemplarily shows the resistance value of each of the seven second detection wires TL2 (see FIG. 6).

Referring to FIGS. 6 and 7A together, the first detection wires TL1 may include first to fifth first detection wires TL1_1, TL1_2, TL1_3, TL1_4, and TL1_5. The first to fifth detection wires TL1_1, TL1_2, TL1_3, TL1_4, and TL1_5 may be sequentially arranged in the first direction DR1.

The first and second detection wires TL1_1 and TL1_2 may have (1-1)-th and (1-2)-th resistance values R1_1 and R1_2, respectively. The third first detection wire TL1_3 may have a (1-3)-th resistance value R1_3. The fourth and fifth first detection wires TL1_4 and TL1_5 may have (1-2)-th and (1-1)-th resistance values R1_2 and R1_1.

In one embodiment, the first and fifth first detection wires TL1_1 and TL1_5 may have substantially the same resistance value, and the second and fourth first detection wires TL1_2 and TL1_4 may have substantially the same resistance values. However, the embodiment of the inventive concept is not necessarily limited to this, and at least one of the first and fifth first detection wires TL1_1 and TL1_5 and the second and fourth first detection wires TL1_2 and TL1_4 may have different resistance values.

For example, among the first to fifth first detection wires TL1_1, TL1_2, TL1_3, TL1_4, and TL1_5, a first detection wire disposed in the center corresponds to a third first detection wire TL1_3. The resistance value may gradually decrease from the first first detection wire TL1_1 to the third first detection wire TL1_3. The resistance value may gradually decrease from the fifth first detection wire TL1_5 to the third first detection wire TL1_3.

For example, the (1-1)-th to (1-3)-th resistance values R1_1, R1_2, and R1_3 may have a tendency to gradually decrease. Accordingly, the third first detection wire TL1_3 may have the smallest resistance, and the (1-3)-th resistance value R1_3 may correspond to the minimum value among the (1-1)-th to (1-3)-th resistance values R1_1, R1_2, and R1_3.

However, the embodiment of the inventive concept is not necessarily limited to this, and the first detection wire having the minimum resistance value may vary according to the magnitude and tendency of noise generated in the display panel DP (see FIG. 4A) described below. Alternatively, when an even number of first detection wires are provided, two first detection wires disposed in the center may have a minimum resistance value.

In this embodiment, the first detection wires TL1 may be provided such that resistance values of the first detection wires TL1 are reduced as the connected first detection electrode TE1 (or corresponding first detection electrode) is disposed adjacent to the central portion of the active area AA-I. For example, resistance values of the first detection wires TL1 may be reduced as the first detection electrode connected among the first detection electrodes TE1 is disposed inside. Through this, in the active area AA-I of the input sensor ISL, noise deviation in the first direction DR1 may be reduced. A detailed description of this will be described later.

Referring to FIGS. 6 and 7B together, the second detection wires TL2 may include the first to seventh second detection wires TL2_1, TL2_2, TL2_3, TL2_4, TL2_5, TL2_6, and TL2_7. The first to seventh second detection wires TL2_1, TL2_2, TL2_3, TL2_4, TL2_5, TL2_6, and TL2_7 have ends electrically connected to the second detection electrodes TE2 sequentially arranged in the second direction DR2.

The first to seventh second detection wires TL2_1, TL2_2, TL2_3, TL2_4, TL2_5, TL2_6, and TL2_7 may have 2-1 to 2-7 resistance values R2_1, R2_2, R2_3, R2_4, R2_5, R2_6, and R2_7.

For example, the resistance value may gradually increase from the first second detection wire TL2_1 to the seventh second detection wire TL2_7. Among the second detection wires TL2, the seventh second detection wire TL2_7 extending farthest from the input pad part PDP-I and disposed on the outermost side may have the greatest resistance. Also, the resistance increase rate between the adjacent second detection wires TL2, for example, the resistance difference between the adjacent second detection wires TL2, may gradually increase toward the seventh second detection wire TL2_7.

In this embodiment, the second detection wires TL2 may have an increased resistance value as the connected second detection electrode TE2 gets farther from the input pad part PDP-I (or circuit board PCB (see FIG. 4a)). In this case, as the connected second detection electrode TE2 is further away from the input pad part PDP-I, the resistance increase rate between the adjacent second detection wires TL2 may increase. For example, a resistance difference between adjacent second detection wires TL2 may increase as the connected second detection electrode TE2 moves away from the input pad part PDP-I. Through this, in the active area AA-I of the input sensor ISL, noise deviation in the second direction DR2 may be reduced. A detailed description of this will be described later.

Figure 8:
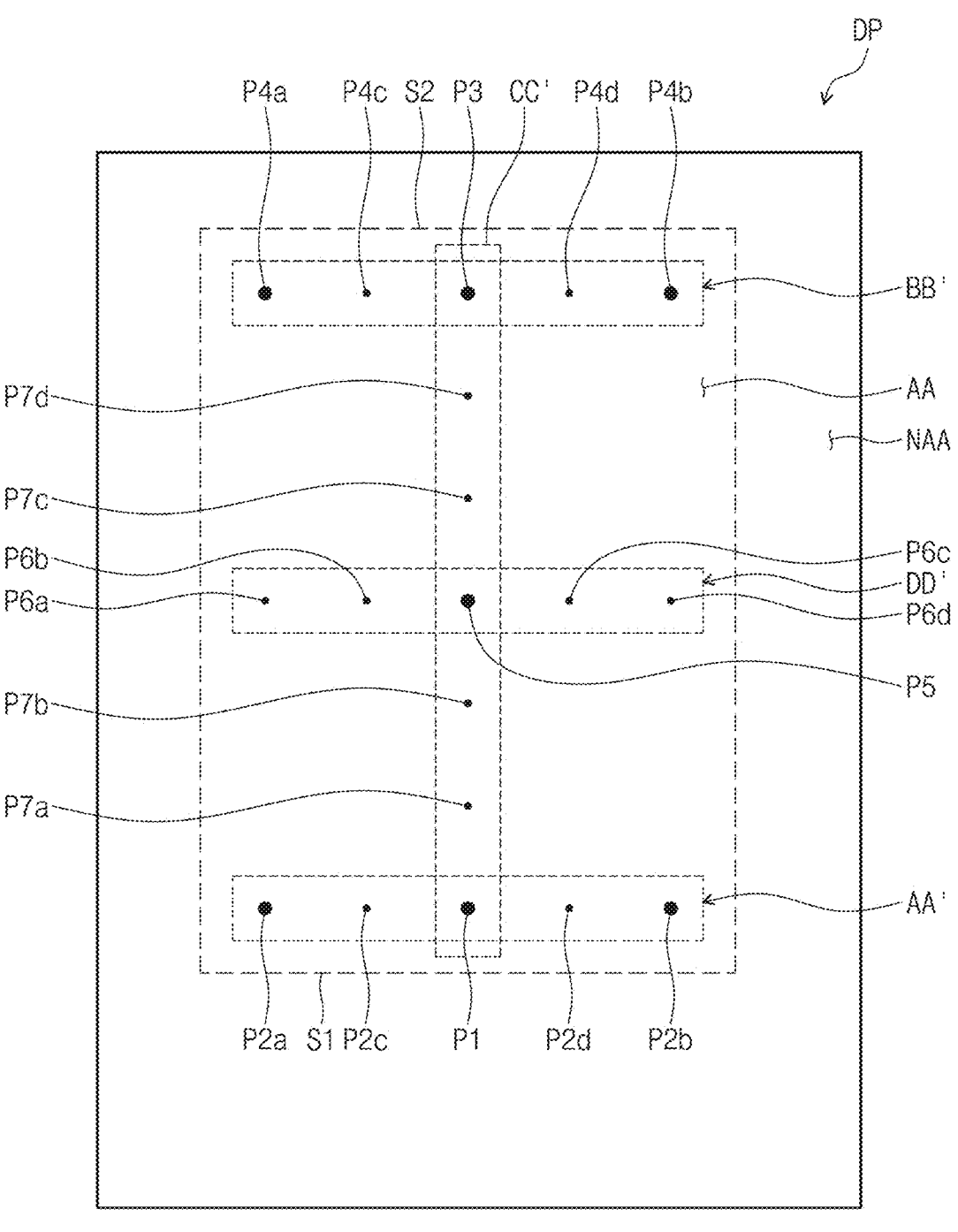
FIG. 8 is a plan view showing points in areas of a display panel according to an embodiment of the inventive concept.
Figure 9A:
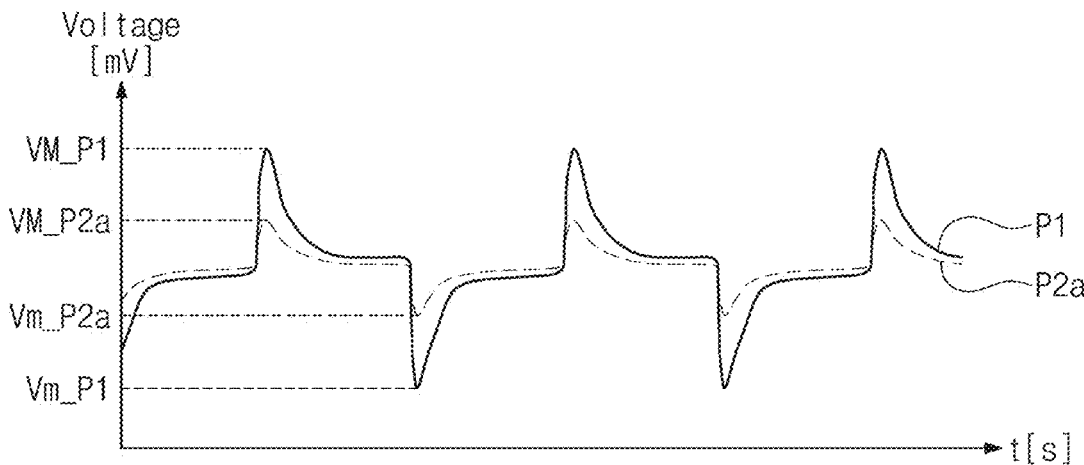
FIGS. 9A to 9C are graphs showing voltage waveforms at points of the display panel shown in FIG. 8.
Figure 9B:
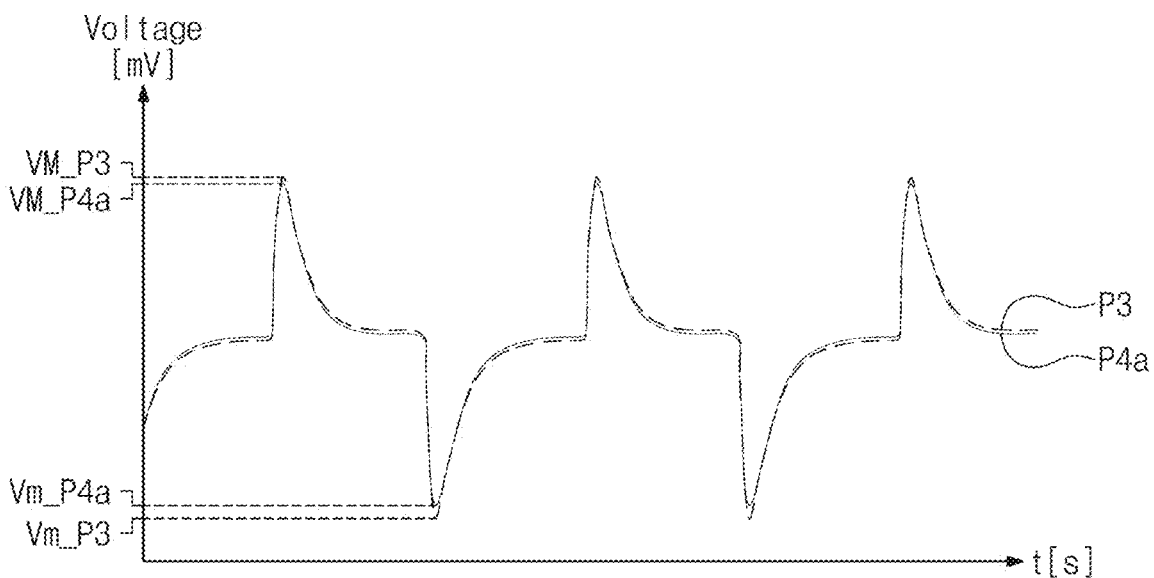
Figure 9C:
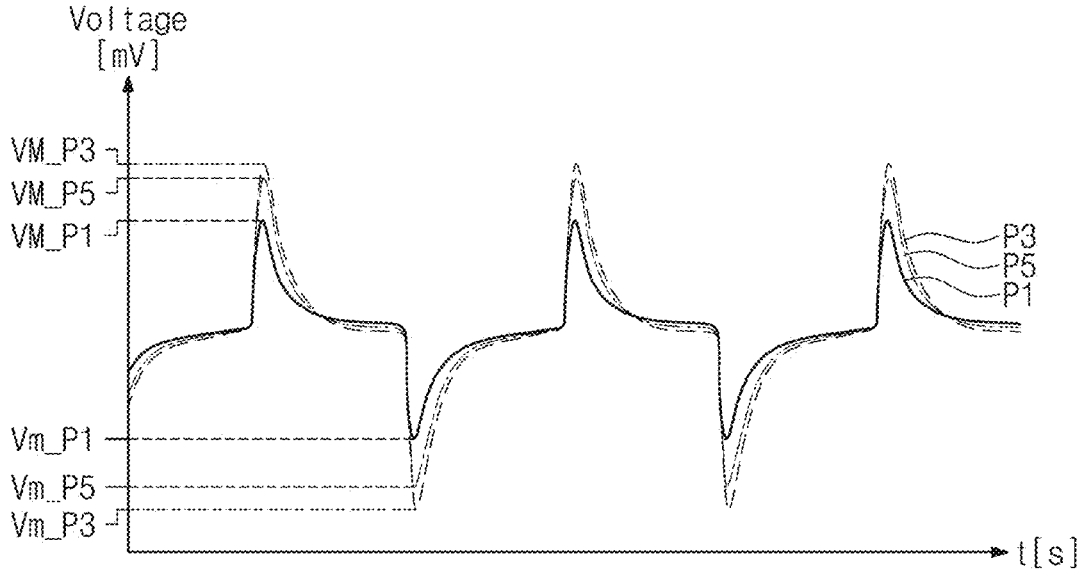
Figure 10A:
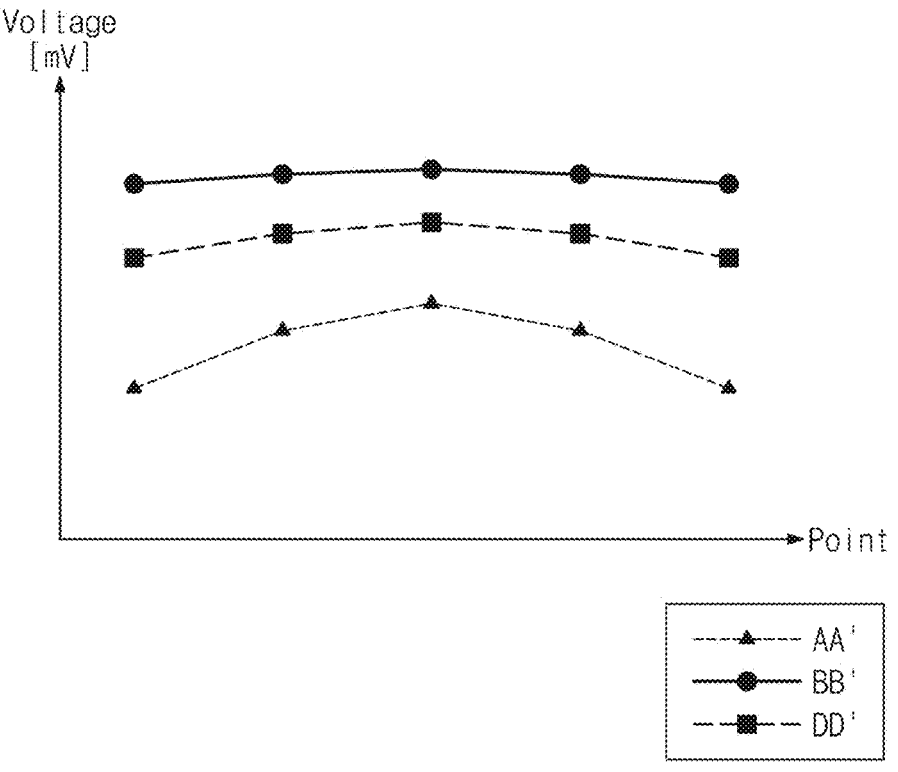
FIGS. 10A and 10B are graphs showing maximum voltage values at points of the display panel shown in FIG. 8.
Figure 10B:
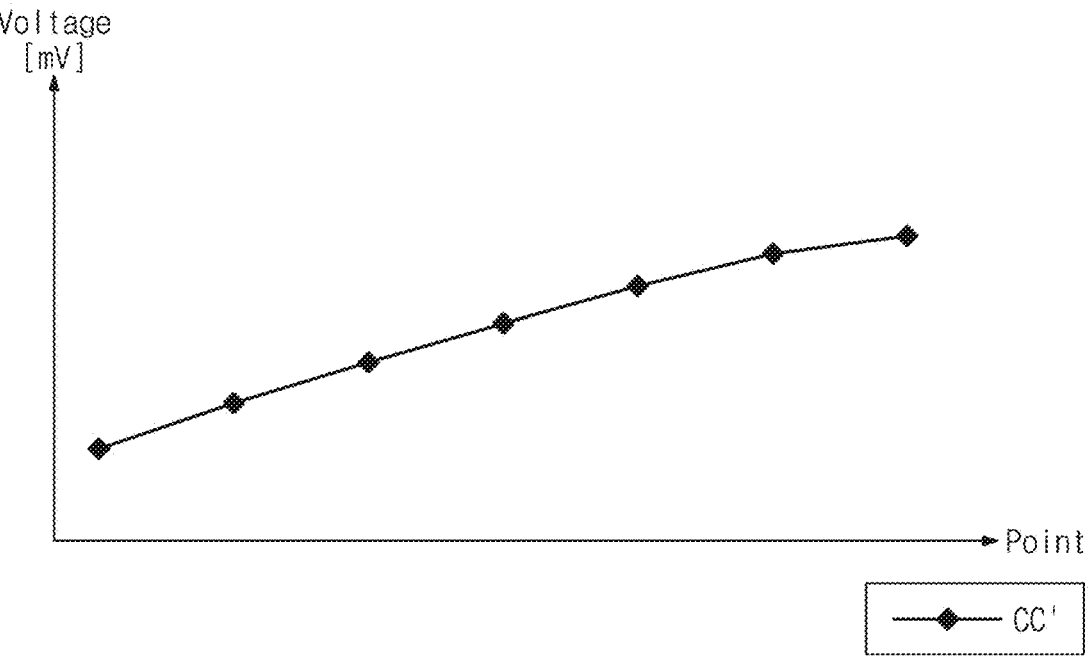

FIG. 8 is a plan view showing points on a display panel according to an embodiment of the inventive concept. FIGS. 9A to 9C are graphs showing voltage waveforms at points of the display panel shown in FIG. 8. FIGS. 10A and 10B are graphs showing maximum voltage values at points of the display panel shown in FIG. 8.

FIGS. 9A to 9C are graphs showing results of measuring voltage changes at the second electrode CE (see FIG. 4B) of the display panel DP at different locations within the active area AA. In this embodiment, the voltage change at the second electrode CE (see FIG. 4B) was measured using an oscilloscope.

FIG. 9A illustrates voltage waveforms measured at points within an area AA' disposed adjacent to the first side S1 (i.e., the lower portion) of the active area AA of the display panel DP shown in FIG. 8. FIG. 9B illustrates voltage waveforms measured at points in an area B" disposed adjacent to the second side S2 (i.e., the upper portion) of the active area AA of the display panel DP shown in FIG. 8. Each of the areas A" and B" may be an area extending in the first direction DR1. FIG. 9C shows voltage waveforms measured at some points within an area CC' disposed in the center of the active area AA of the display panel DP. The area CC' may be an area extending from the central portion of the active area AA in the second direction DR2.

Referring to FIGS. 8 and 9A, voltage changes were measured at the first point P1, the (2-1)-st point P2a, and the (2-2)-nd point P2b within the area AA'. In the first direction DR1, the (2-1)-st point P2a, the first point P1, and the (2-2)-nd point P2b are sequentially arranged, and the first point P1 corresponds to the central point in the area AA'. Since substantially the same voltage values were measured at the (2-1)-st and (2-2)-nd points P2a and P2b, only the graph of the (2-1)-st point P2a is shown in FIG. 9A.

As shown in FIG. 9A, referring to the voltage change graph at the first point P1, it may have a maximum voltage value (corresponding to Vpeak) at the (1-1)-st voltage VM_P1 and a minimum voltage value at the (1-2)-nd voltage Vm_P1. Referring to the voltage change graph at the (2-1)-st point P2a, it may have a maximum voltage value (corresponding to Vpeak) at the (2-1)-st voltage VM_P2a and a minimum voltage value at the (2-2)-nd voltage Vm_P2a.

The (1-1)-st voltage VM_P1 is greater than the (2-1)-st voltage VM_P2a, and the absolute value of the (1-2)-nd voltage Vm_P1 may be greater than the absolute value of the (2-2)-nd voltage Vm_P2a. For example, it may be checked that the noise value of the second electrode CE of the display panel DP (see FIG. 4B) is greater at the first point P1 than at the (2-1)-st and (2-2)-nd points P2a and P2b, and through this, it may be checked that the noise at the second electrode CE (see FIG. 4B) increases as it approaches the central portion of the display panel DP.

Referring to FIGS. 8 and 9B, voltage changes were measured at the third point P3, the (4-1)-st point P4a, and the (4-2)-nd point P4b in the area BB'. In the first direction DR1, the (4-1)-st point P4a, the third point P3, and the (4-2)-nd point P4b are sequentially arranged, and the third point P3 corresponds to the central point in the area B". Since substantially the same voltage values were measured at the (4-1)-st and (4-2)-nd points P4a and P4b, only the graph of the (4-1)-st point P4a is shown in FIG. 9B.

As shown in FIG. 9B, referring to the voltage change graph at the third point P3, it may have a maximum voltage value (corresponding to Vpeak) at the (3-1)-st voltage VM_P3 and a minimum voltage value at the (3-2)-nd voltage Vm_P3. Referring to the voltage change graph at the (4-1)-st point P4a, it may have a maximum voltage value (corresponding to Vpeak) at the (4-1)-st voltage VM_P4a and a minimum voltage value at the (4-2)-nd voltage Vm_P4a.

The (3-1)-st voltage VM_P3 is greater than the (4-1)-st voltage VM_P4a, and the absolute value of the (3-2)-nd voltage Vm_P3 may be greater than the absolute value of the (4-2)-nd voltage Vm_P4a. For example, it may be checked that the noise value of the second electrode CE of the display panel DP (see FIG. 4B) is greater at the third point P3 than at the (4-1)-st and (4-2)-nd points P4a and P4b and through this, it may be checked that the noise at the second electrode CE (see FIG. 4B) increases as it approaches the central portion of the display panel DP.

Referring to FIGS. 8 and 9C, voltage changes were measured at a first point P1, a third point P3, and a fifth point P5 in the area CC'. The first point P1, the third point P3, and the fifth point P5 are sequentially arranged in the second direction DR2, and the third point P3 corresponds to a point within the area CC'.

The voltage change graph at the first point P1 shown in FIG. 9C is the same as the voltage change graph at the first point P1 shown in FIG. 9A, and the voltage change graph at the third point P3 shown in FIG. 9C is the same as the voltage change graph at the third point P3 shown in FIG. 9B, such that to the extent that a detailed explanation for particular features has been omitted, it may be understood that these features are at least similar to corresponding features that have been described elsewhere within the present disclosure.

Referring to the voltage change graph at the fifth point P5, it may have a maximum voltage value (corresponding to Vpeak) at the (5-1)-st voltage VM_P5 and has a minimum voltage value at the (5-2)-nd voltage Vm_P5. The (5-1)-st voltage VM_P5 may be greater than the (1-1)-st voltage VM_P1 and may be less than the (3-1)-st voltage VM_P3. The absolute value of the (5-2)-nd voltage Vm_P5 may be greater than the absolute value of the (1-2)-nd voltage Vm_P1 and may be smaller than the absolute value of the (3-2)-nd voltage Vm_P3. For example, it may be confirmed that the noise value of the second electrode CE of the display panel DP (see FIG. 4B) is greater at the third point P3 than at the first point P1, and noise is greater at the fifth point P5 than at the third point P3. Through this, it may be seen that the noise at the second electrode CE (see FIG. 4B) increases as the distance from the circuit board PCB (see FIG. 4A) increases.

FIGS. 10A and 10B show a graph of maximum voltage values (i.e., Vpeak values) for each position after measuring a voltage change at the second electrode CE (see FIG. 4B) at positions of the first to fifth points P1 to P5 and other points described above with reference to FIGS. 8 to 9C in the active area AA of the display panel DP. Voltage changes at other points were measured using an oscilloscope as described above with reference to FIGS. 9A to 9C.

FIG. 10A is a graph showing maximum voltage values at some points in areas A", areas B", and areas D" in the active area AA of the display panel DP. It is shown in the form of a line graph so that it is easy to grasp the tendency of the maximum voltage value for each position within the active area AA.

Referring to FIGS. 8 and 10A, the description of the area A" and the area B" may be equally applied to the description described above with reference to FIG. 8, and the area D" may be an area disposed in the center of the active area AA of the display panel DP and extending in the first direction DR1.

FIG. 10A shows the maximum voltage values at the first, (2-1)-st, and (2-2)-nd points P1, P2a, and P2b and at the (2-3)-rd and (2-4)-th points P2c and P2d in the area AA' of FIG. 8. The (2-3)-rd point P2c may be located between the first and (2-1)-st points P1 and P2a, and the (2-4)-th point P2d may be located between the first and (2-2)-nd points P1 and P2b.

The (2-1)-st, (2-3)-rd, first, (2-4)-th, and (2-2)-nd points P2a, P2c, P1, P2d, and P2b may be sequentially arranged in the first direction DR1, and the graph A" of FIG. 10A sequentially represents points arranged in the first direction DR1.

Referring to the graph of the maximum voltage value in the area A", the maximum voltage value increases from the (2-1)-st point P2a to the first point P1, and the maximum voltage value may increase from the (2-2)-nd point P2b to the first point P1. For example, it may be confirmed that the maximum voltage value increases as it approaches the central portion within the area AA'.

FIG. 10A shows the maximum voltage values at the third, (4-1)-st, and (4-2)-nd points P3, P4a, and P4b and at the (4-3)-rd and (4-4)-th points P4c and P4d in the area BB' of FIG. 8. The (4-3)-rd point P4c may be located between the third and (4-1)-st points P3 and P4a, and the (4-4)-th point P4d may be located between the third and (4-2)-nd points P3 and P4b.

The (4-1)-st, (4-3)-rd, third, (4-4)-th, and (4-2)-nd points P4a, P4c, P3, P4d, and P4b may be sequentially arranged in the first direction DR1, and the graph B" of FIG. 10A sequentially represents points arranged in the first direction DR1.

Referring to the graph of the maximum voltage value in the area B", the maximum voltage value increases from the (4-1)-st point P4a to the third point P3, and the maximum voltage value may increase from the (4-2)-nd point P4b to the third point P3. For example, it may be confirmed that the maximum voltage value increases as it approaches the central portion within the area BB'.

FIG. 10A shows maximum voltage values at a fifth point P5 and (6-1)-st to (6-4)-th points P6a, P6b, P6c, and Pod in the area DD' of FIG. 8. The (6-1)-st point P6a, the (6-2)-nd point P6b, the fifth point P5, the (6-3)-rd point P6c, and the (6-2)-nd point Pod are arranged sequentially in the first direction DR1, and the fifth point P5 corresponds to the central point in the area D". The graph D" of FIG. 10B sequentially represents points arranged in the first direction DR1.

Referring to the graph of the maximum voltage value in the area D", the maximum voltage value increases from the (6-1)-st point P6a to the fifth point P5, and the maximum voltage value may increase from the (6-4)-th point Pod to the fifth point P5. For example, it may be confirmed that the maximum voltage value increases as it approaches the central portion within the area DD'.

For example, referring to the graphs of maximum voltage values in areas A", areas B", and areas D", it may be seen that the noise at the second electrode CE of the display panel DP (see FIG. 4B) increases toward the central portion with respect to the first direction DR1. While the pixels PX (see FIG. 4A) are arranged closer to the central portion, as the path through which the second voltage is supplied from the second voltage line PL2 (see FIG. 4A) to the second electrode CE (see FIG. 4B) of the corresponding pixel becomes longer, the resistance value increases, such that noise at the second electrode CE (see FIG. 4B) may also increase.

FIG. 10B is a graph showing maximum voltage values at some points within the area CC' in the active area AA of the display panel DP. It is shown in the form of a line graph so that it is easy to grasp the tendency of the maximum voltage value for each position within the active area AA.

Referring to FIGS. 8 and 10B, the description described above with reference to FIG. 9C may be applied to the area C" in the same manner, and maximum voltage values were measured at the first, third, and fifth points P1, P3, and P5 and the (7-1)-st, (7-2)-nd, (7-3)-rd, and (7-4)-th points P7a, P7b, at P7c, and P7d.

The (7-1)-st and (7-2)-nd points P7a and P7b may be located between the first and fifth points P1 and P5. The (7-1)-st point P7a may be located more adjacent to the first point P1, and the (7-2)-nd point P7b may be located more adjacent to the fifth point P5. The (7-3)-rd and (7-4)-th points P7c and P7d may be located between the third and fifth points P3 and P5. The (7-3)-rd point P7c may be located closer to the fifth point P5, and the (7-4)-th point P7d may be located closer to the third point P3.

The first, (7-1)-st, (7-2)-nd, fifth, (7-3)-rd, (7-4)-th, and third points P1, P7a, P7b, P5, P7c, P7d, and P3 are in the second direction (DR2) may be arranged sequentially, and the graph C" of FIG. 10B sequentially represents points arranged in the first direction DR1.

Referring to the maximum voltage value graph in the area C", the maximum voltage value may increase from the first point P1 to the third point P3. In this case, the rate of increase of the maximum voltage value between adjacent points may decrease from the first point P1 to the third point P3. For example, the difference between the maximum voltage values between adjacent points may decrease from the first point P1 to the third point P3.

For example, it may be seen that within the area C'', the maximum voltage value increases from the first side S1 to the second side S2 (i.e., from the lower part to the upper part) of the active area AA, and within the area C'', and the increase rate of the maximum voltage value decreases from the first side S1 to the second side S2 of the active area AA.

Accordingly, it may be seen that the noise at the second electrode CE (see FIG. 4B) increases as the distance from the circuit board PCB (see FIG. 4a) increases based on the second direction DR2, and the noise increase rate decreases as the distance from the circuit board PCB (see FIG. 4a) increases based on the second direction DR2.

While the pixels PX (see FIG. 4A) are arranged farther from the circuit board PCB (see FIG. 4A), as the path through which the second voltage is provided from the voltage generator in the circuit board PCB (see FIG. 4A) to the second electrode CE (see FIG. 4B) of the corresponding pixel becomes longer, the resistance value increases, such that noise at the second electrode CE (see FIG. 4B) may also increase.

According to the recent setting to reduce the thickness of the display device DD (see FIG. 1), the distance between the second electrode CE (see FIG. 4B) in the display panel DP and the input sensor ISL (see FIG. 5) becomes shorter. Accordingly, the input sensor ISL (see FIG. 5) receives electrical interference from the display panel DP due to noise generated from the second electrode CE (see FIG. 4B), so that noise may also be generated in the input sensor ISL (see FIG. 5).

Referring to FIGS. 6, 7A, and 10A together, in this embodiment, resistance values of the first detection wires TL1 tend to decrease as the connected first detection electrode TE1 is disposed adjacent to the central portion, such that even if the noise at the second electrode CE (see FIG. 4B) increases as it is closer to the central portion in the first direction DR1, noise deviation with respect to the first direction DR1 within the active area AA-I of the input sensor ISL may be minimized.

Also, referring to FIGS. 6, 7B, and 10B together, in this embodiment, the resistance increase rate between adjacent second detection wires TL2 tends to decrease as the connected second detection electrode TE2 moves away from the input pad part PDP-I, such that even if the noise increase rate of the second electrode CE (see FIG. 4B) increases as the distance from the input pad part PDP-I is increased with respect to the second direction DR2, noise deviation in the second direction DR2 within the active area AA-I of the input sensor ISL may be minimized.

For example, according to the inventive concept, considering the tendency of noise generated from the second electrode CE (see FIG. 4B) of the display panel DP, resistance values of the first and second detection wires TL1 and TL2 may be controlled. Noise deviation in the first direction DR1 may be reduced by controlling resistance values of the first detection wires TL1, and noise deviation in the second direction DR2 may be reduced by controlling resistance values of the second detection wires TL2. A detailed description of a method of controlling the resistance values of the first and second detection wires TL1 and TL2 will be described later.

Figure 11A:
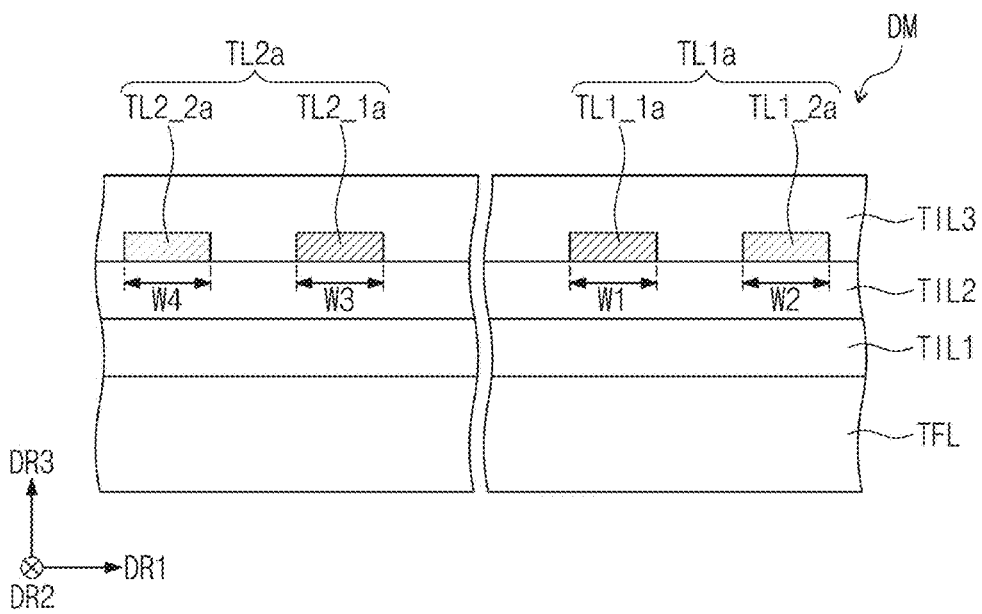
FIGS. 11A and 11B are enlarged cross-sectional views of components of a display module according to an embodiment of the inventive concept.
Figure 11B:
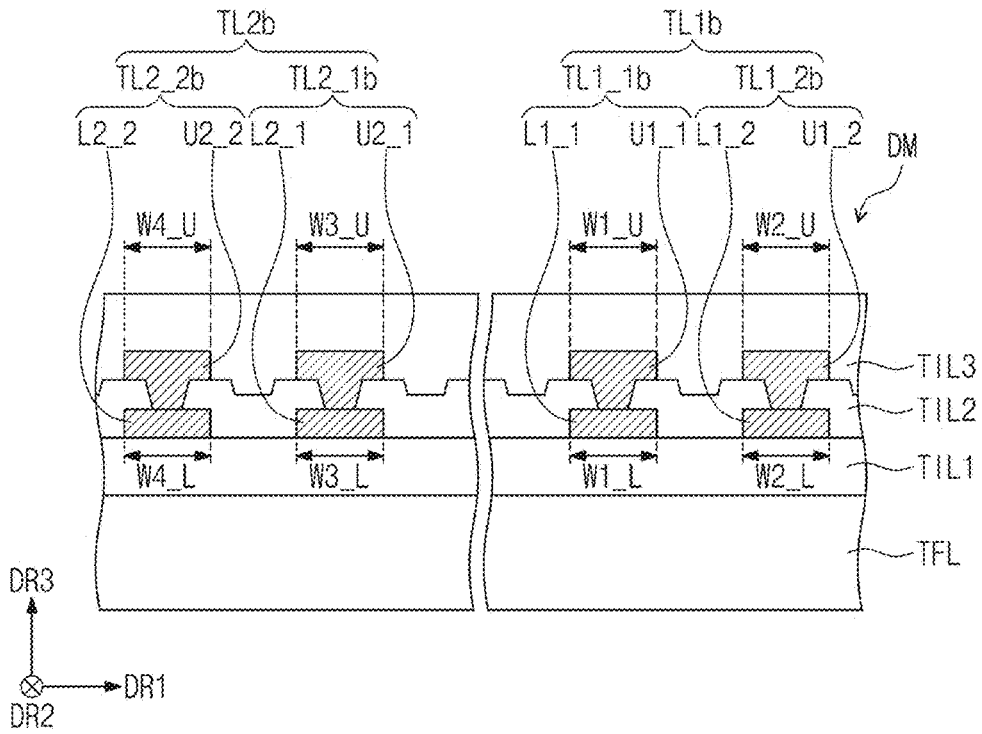

FIGS. 11A and 11B are enlarged cross-sectional views of components of a display module according to an embodiment of the inventive concept. FIGS. 11A and 11B show cross-sectional structures of a portion of first detection wires TL1a and a portion of second detection wires TL2b.

FIG. 11A illustrates cross-sections of two first detection wires (hereinafter referred to as the (1-1)-st detection wire TL1_1a and the (1-2)-nd detection wire TL1_2a, respectively) among the first detection wires TL1a and two second detection wires (hereinafter referred to as (2-1)-st detection wire TL2_1a and (2-2)-nd detection wire TL2_2b, respectively) among the second detection wires TL2b.

Referring to FIG. 11A, each of the first detection wires TL1a and the second detection wires TL2a according to the present embodiment may have a single layer structure. Each of the first and second detection wires TL1a and TL2a may be disposed on the second detection insulating layer TIL2 and at least partially covered by the third detection insulating layer TIL3. For example, the first and second detection wires TL1a and TL2a may be components included in the second detection conductive layer TML2 described above with reference to FIG. 5.

The embodiment of the inventive concept is not necessarily limited thereto, and each of the first and second detection wires TL1a and TL2a may be disposed on the first detection insulating layer TIL1 and at least partially covered by the second detection insulating layer TIL2. For example, the first and second detection wires TL1a and TL2a may be included in the first detection conductive layer TML1.

The (1-1)-st and (1-2)-nd detection wires TL1_1a and TL1_2a may have first and second wiring widths W1 and W2 when viewed from the extension direction, respectively. When viewed from the extension direction, the (2-1)-st and (2-2)-nd detection wires TL2_1a and TL2_2a may have third and fourth wiring widths W3 and W4, respectively. FIG. 11A shows that the first to fourth wiring widths W1, W2, W3, and W4 are substantially the same as an example, but is not necessarily limited thereto, and at least some of the first to fourth wiring widths W1, W2, W3, and W4 may have different wiring widths.

According to the inventive concept, in order to control resistance values of the detection wires TL1a and TL2a, wiring widths W1, W2, W3, and W4 of the detection wires TL1a and TL2a may be controlled. For example, when the resistance value of one detection wire needs to be reduced to reduce the noise deviation, the wiring width of the one detection wire may be designed to be smaller than the reference wiring width before considering the noise deviation. Alternatively, when the resistance value of one detection wire needs to be increased to reduce the noise deviation, the wiring width of the one detection wire may be designed to be larger than the reference wiring width before considering the noise deviation.

FIG. 11B illustrates cross-sections of two first detection wires (hereinafter referred to as (1-1)-st detection wire TL1_1b and (1-2)-nd detection wire TL1_2b, respectively) among the first detection wires TL1b and two second detection wires (hereinafter referred to as (2-1)-st detection wire TL2_1b and (2-2)-nd detection wire TL2_2b, respectively) among the second detection wires TL2b.

Referring to FIG. 11B, each of the first detection wires TL1b and the second detection wires TL2b according to the present embodiment may have a multilayer structure.

The (1-1)-st detection wire TL1_1b may include a (1-1)-st lower wire L1_1 and a (1-1)-st upper wire U1_1, and the (1-2)-nd detection wire TL1_2b may include a (1-2)-nd lower wire L1_2 and a (1-2)-nd upper wire U1_2. The (2-1)-st detection wire TL2_1b may include a (2-1)-st lower wire L2_1 and a (2-1)-st upper wire U2_1, and the (2-2)-nd detection wire TL2_2b may include a (2-2)-nd lower wire L2_2 and a (2-2)-nd upper wire U2_2.

Each of the (1-1)-st, (1-2)-nd, (2-1)-st, and (2-2)-nd lower wires L1_1, L1_2, L2_1, and L2_2 may be disposed on the first detection insulating layer TIL1, and may be at least partially covered by a second detection insulating layer TIL2. For example, the (1-1)-st, (1-2)-nd, (2-1)-st, and (2-2)-nd lower wires L1_1, L1_2, L2_1, and L2_2 may be included in the first detection conductive layer TML1 (see FIG. 5).

Each of the (1-1)-st, (1-2)-nd, (2-1)-st, and (2-2)-nd upper wires U1_1, U1_2, U2_1, and U2_2 may be disposed on the second detection insulating layer TIL2, and may be at least partially covered by a third detection insulating layer TIL3. For example, the (1-1)-st, (1-2)-nd, (2-1)-st, and (2-2)-nd upper wires U1_1, U1_2, U2_1, and U2_2 may be included in the second detection conductive layer TML2 (see FIG. 5).

The (1-1)-st, (1-2)-nd, (2-1)-st, and (2-2)-nd lower wires L1_1, L1_2, L2_1, and L2_2 may have first to fourth lower wiring widths W1_L, W2_L, W3_L, and W4_L when viewed from each extension direction. The (1-1)-st, (1-2)-nd, (2-1)-st, and (2-2)-nd upper wires U1_1, U1_2, U2_1, and U2_2 may have the first to fourth upper wiring widths W1_U, W2_U, W3_U, and W4_U when viewed from each extension direction.

FIG. 11B exemplarily illustrates that the first to fourth lower wiring widths W1_L, W2_L, W3_L, and W4_L and the first to fourth upper wiring widths U1_1, U1_2, U2_1, and U2_2 are substantially the same but are not necessarily limited thereto, and at least some of the first to fourth lower wiring widths W1_L, W2_L, W3_L, and W4_L and the first to fourth upper wiring widths W1_U, W2_U, W3_U, and W4_U may have different wiring widths.

According to the inventive concept, in order to control the resistance values of the detection wires TL1b and TL2b, the wiring widths W1_L to W4_L, and W1_U to W4_U of the detection wires TL1b and TL2b may be controlled, and in this embodiment, the wiring widths (i.e., lower wiring widths W1_L, W2_L, W3_L, and W4_L) of wires (i.e., lower wires L1_1, L1_2, L2_1, and L2_2) disposed on the first detection insulating layer TIL1 and included in the first detection conductive layer TML1 may be controlled or the wiring widths (i.e., upper wiring widths W1_U, W2_U, W3_U, and W4_U) of wires (i.e., upper wires U1_1, U1_2, U2_1, and U2_2) disposed on the second detection insulating layer TIL2 and included in the second detection conductive layer TML2 may be controlled. Alternatively, both lower wiring widths of lower wires and upper wiring widths of upper wires may be controlled.

Figure 12:
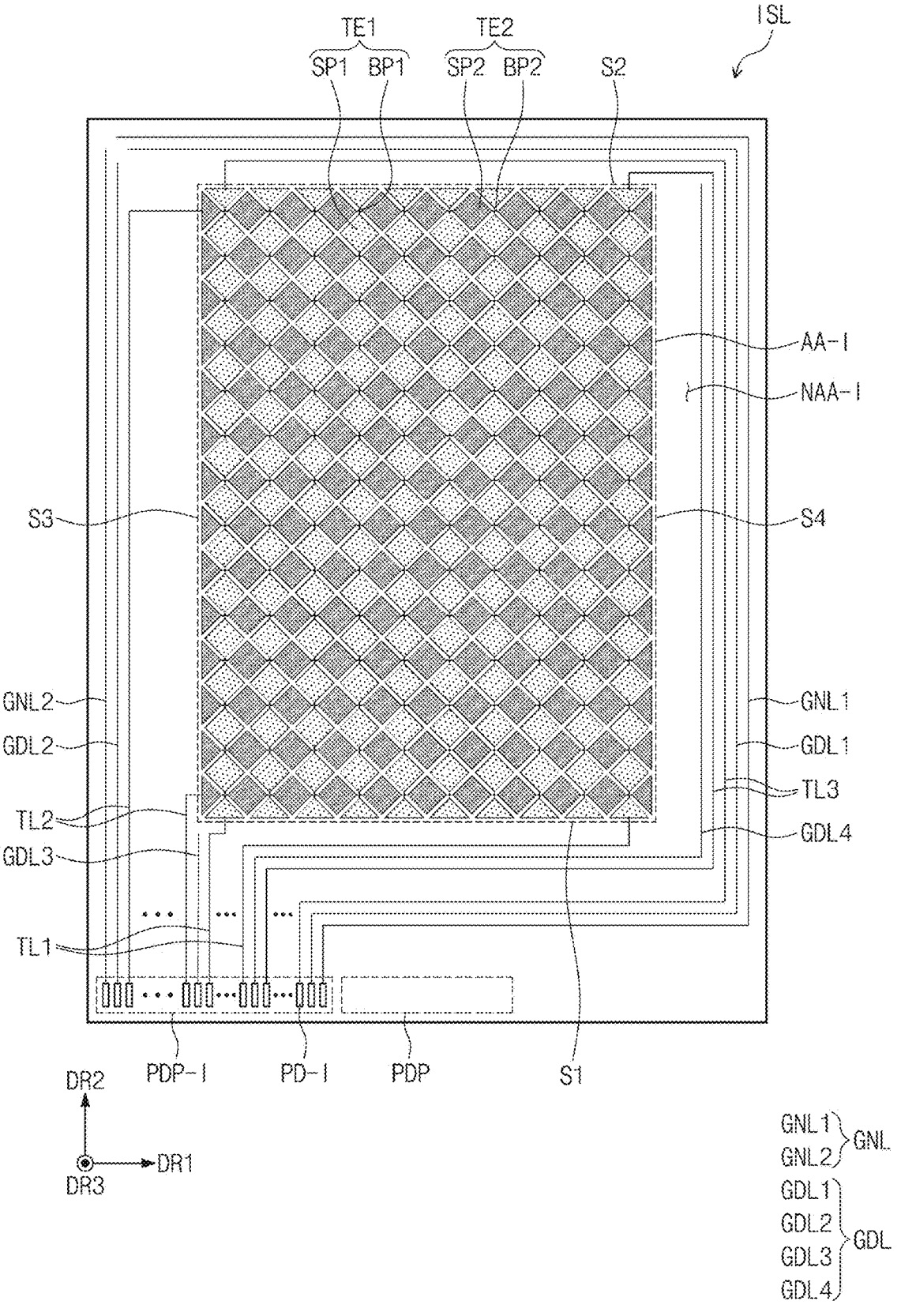
FIG. 12 is a plan view of an input sensor according to an embodiment of the inventive concept.

FIG. 12 is a plan view of an input sensor according to an embodiment of the inventive concept.

Referring to FIG. 12, the input sensor ISL may include a plurality of detection electrodes TE1 and TE2, a plurality of detection wires TL1, TL2 and TL3 respectively electrically connected to the detection electrodes TE1 and TE2, an input pad part PDP-I, at least one ground wire GNL, and at least one guard wire GDL. The same/similar reference numerals are used for the same/similar configurations as those described with reference to FIG. 6A, and to the extent that descriptions of elements are omitted, it may be understood that these elements are at least similar to corresponding elements that have been described elsewhere within the present disclosure.

In this embodiment, the detection wires TL1, TL2, and TL3 may include first detection wires TL1, second detection wires TL2, and third detection wires TL3. Since the description of the first and second detection wires TL1 and TL2 may be equally applied to the description of FIG. 6, it is to be understood that to the extent that descriptions of elements are omitted, these elements are at least similar to corresponding elements that have been described elsewhere within the present disclosure.

Each of the third detection wires TL3 may be electrically connected to the other end of a corresponding first detection electrode among the first detection electrodes TE1. Among both ends of the first detection electrode TE1, one end adjacent to the input pad part PDP-I may be electrically connected to the first detection wire TL1, and the other end opposite to one end may be electrically connected to the third detection wire TL3.

The third detection wires TL3 may be designed to have resistance values showing similar tendencies to those of the first detection wires TL1. For example, the resistance of the third detection wires TL3 may be reduced as the connected first detection electrode TE1 is disposed adjacent to the central portion of the active area AA-I. Through this, even if the noise generated from the second electrode CE (see FIG. 4B) increases as it approaches the center of the active area AA-I with respect to the first direction DR1, variation of noise generated in the input sensor ISL may be reduced, and detection reliability may be increased.

In this embodiment, at least one guard wire GDL may include a first guard wire GDL1, a second guard wire GDL2, a third guard wire GDL3, and a fourth guard wire GDL4. Since the description of the first to third guard wires GDL1, GDL2, and GDL3 may be equally applied to the description of FIG. 6, to the extent that descriptions of elements are omitted, it may be understood that these elements are at least similar to corresponding elements that have been described elsewhere within the present disclosure.

The fourth guard wire GDL4 may extend along the first and fourth sides S1 and S4 from a corresponding input pad among the input pads PD-I. The fourth guard wire GDL4 may be disposed between the first and third detection wires adjacent to each other among the first and third detection wires TL1 and TL3 in a portion extending along the first side S1 of the active area AA-I. The fourth guard wire GDL4 may be disposed between the active area AA-I and the third detection wires TL3 in a portion extending along the fourth side S4 of the active area AA-I. In this embodiment, the first guard wire GDL1 may be disposed beyond the third detection wires TL3, and the fourth guard wire GDL4 may be disposed inside the third detection wires TL3.

Figure 13:
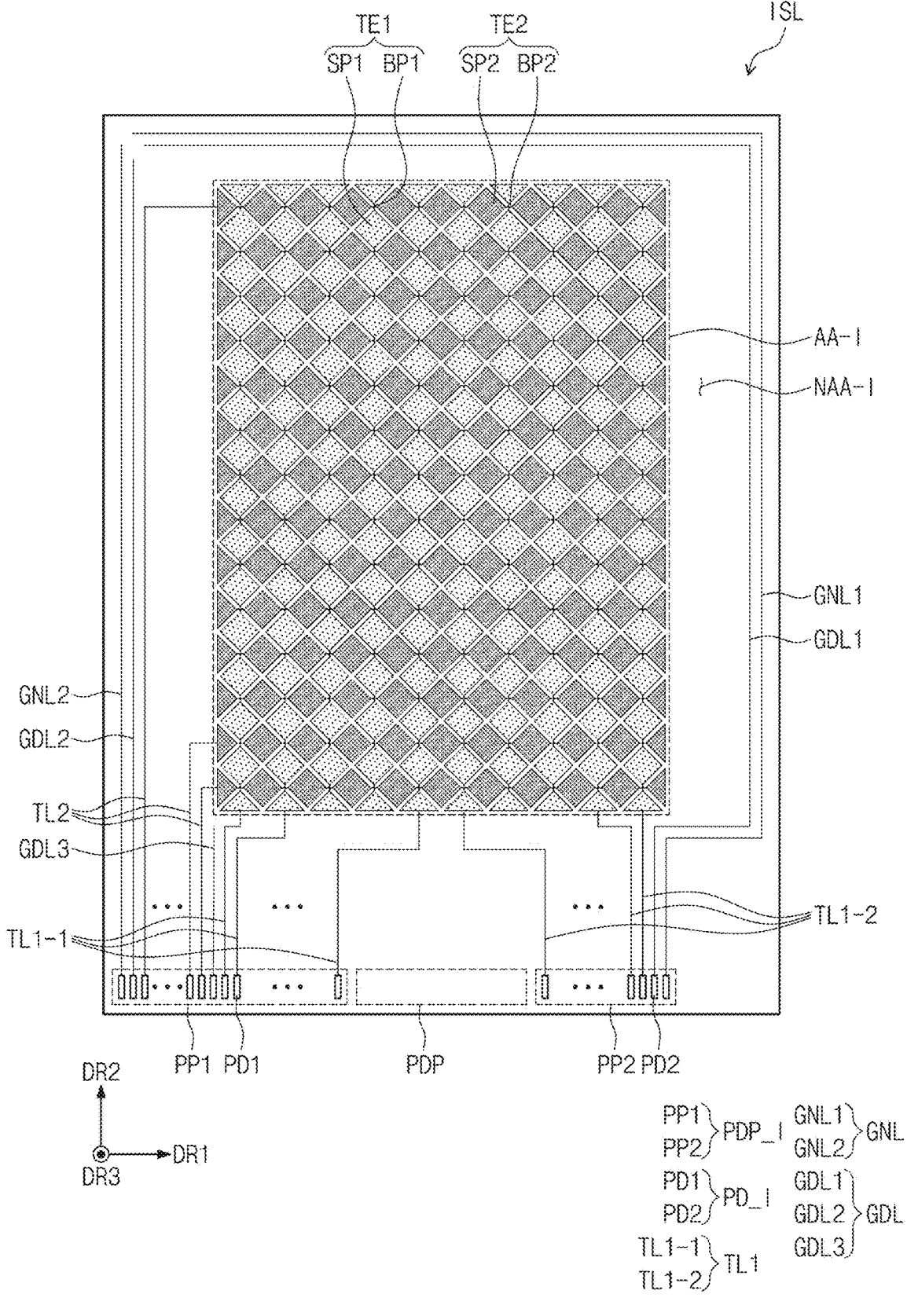
FIG. 13 is a plan view of an input sensor according to an embodiment of the inventive concept.

FIG. 13 is a plan view of an input sensor according to an embodiment of the inventive concept.

Referring to FIG. 13, the input sensor ISL may include a plurality of detection electrodes TE1 and TE2, a plurality of detection wires TL1 and TL2 respectively electrically connected to the detection electrodes TE1 and TE2, an input pad part PDP-I, at least one ground wire GNL, and at least one guard wire GDL. The same/similar reference numerals are used for the same/similar configurations as those described with reference to FIG. 6A, and to the extent that descriptions of elements are omitted, it may be understood that these elements are at least similar to corresponding elements that have been described elsewhere within the present disclosure.

In this embodiment, the detection wires TL1 and TL2 may include first detection wires TL1 and second detection wires TL2. Since the description of the second detection wires may be equally applied to the description of FIG. 6, it will be understood that omitted details are at least similar to corresponding details that have been described elsewhere within the present disclosure.

Each of the first detection wires TL1 may be electrically connected to one end of a corresponding first detection electrode among the first detection electrodes TE1, and one end of the corresponding first detection electrode TE1 may correspond to an end adjacent to the input pad part PDP-I among both ends of the first detection electrode TE1.

In this embodiment, the input pad part PDP-I may include a first pad part PP1 and a second pad part PP2. The first pad part PP1 may be disposed apart from the display pad part PDP to one side, and the second pad part PP2 may be spaced apart from the display pad part PDP to the other side. For example, the first and second pad parts PP1 and PP2 may be spaced apart from each other with the display pad part PDP therebetween. The first pad part PP1 may include the first group input pads PD1, and the second pad part PP2 may include the second group input pads PD2.

The first detection wires TL1 may include first group wires TL1-1 and second group wires TL1-2. The first group wires TL1-1 may be electrically connected to the first pad part PP1, and the second group wires TL1-2 may be electrically connected to the second pad part PP2. Each of the first group wires TL1-1 is electrically connected to the first group input pads PD1, and the second group wires TL1-2 are electrically connected to the second group input pads PD2, respectively.

In one embodiment, among the first detection wires TL1, the first group wires TL1-1 electrically connected to the first pad part PP1 may become longer in the first direction DR1, and among the first detection wires TL1, the second group wires TL1-2 electrically connected to the second pad part PP2 may become shorter in the first direction DR1.

According to an embodiment, the detection wires may further include third detection wires. Each of the third detection wires may be electrically connected to the other end of the corresponding first detection electrode among the first detection electrodes TE1 and to the second pad part PP2.

Figure 14:
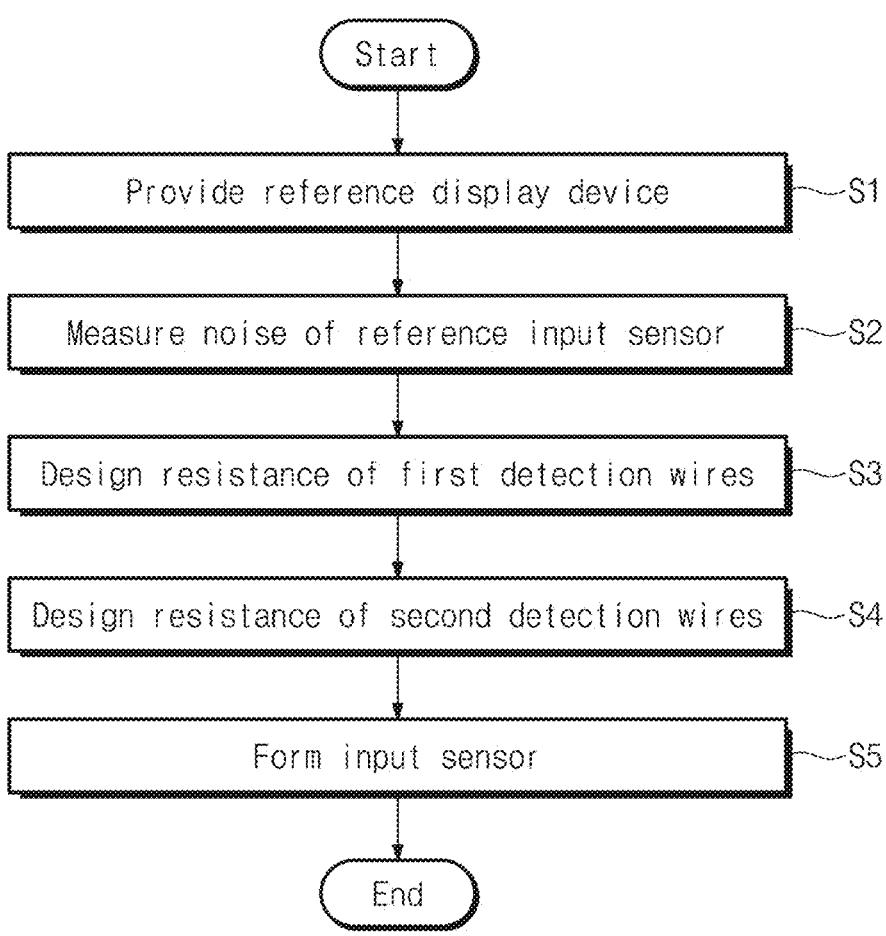
FIG. 14 is a flowchart illustrating a method of manufacturing a display device according to an embodiment of the inventive concept.

FIG. 14 is a flowchart illustrating a method of manufacturing a display device according to an embodiment of the inventive concept.

Referring to FIG. 14, a method of manufacturing a display device according to the present embodiment may include measuring noise of a reference input sensor using a reference display device and forming a display device. The measuring of the noise of the reference input sensor using the reference display device may include providing a reference display device in S1 and measuring noise of the reference input sensor S2, and the forming of the display device may include setting the resistance of the first detection wires in S3, setting the resistance of the second detection wires in S4, and forming the input sensor in S5. Hereinafter, each operation will be described in detail with reference to FIGS. 15 to 18B.

Figure 15:
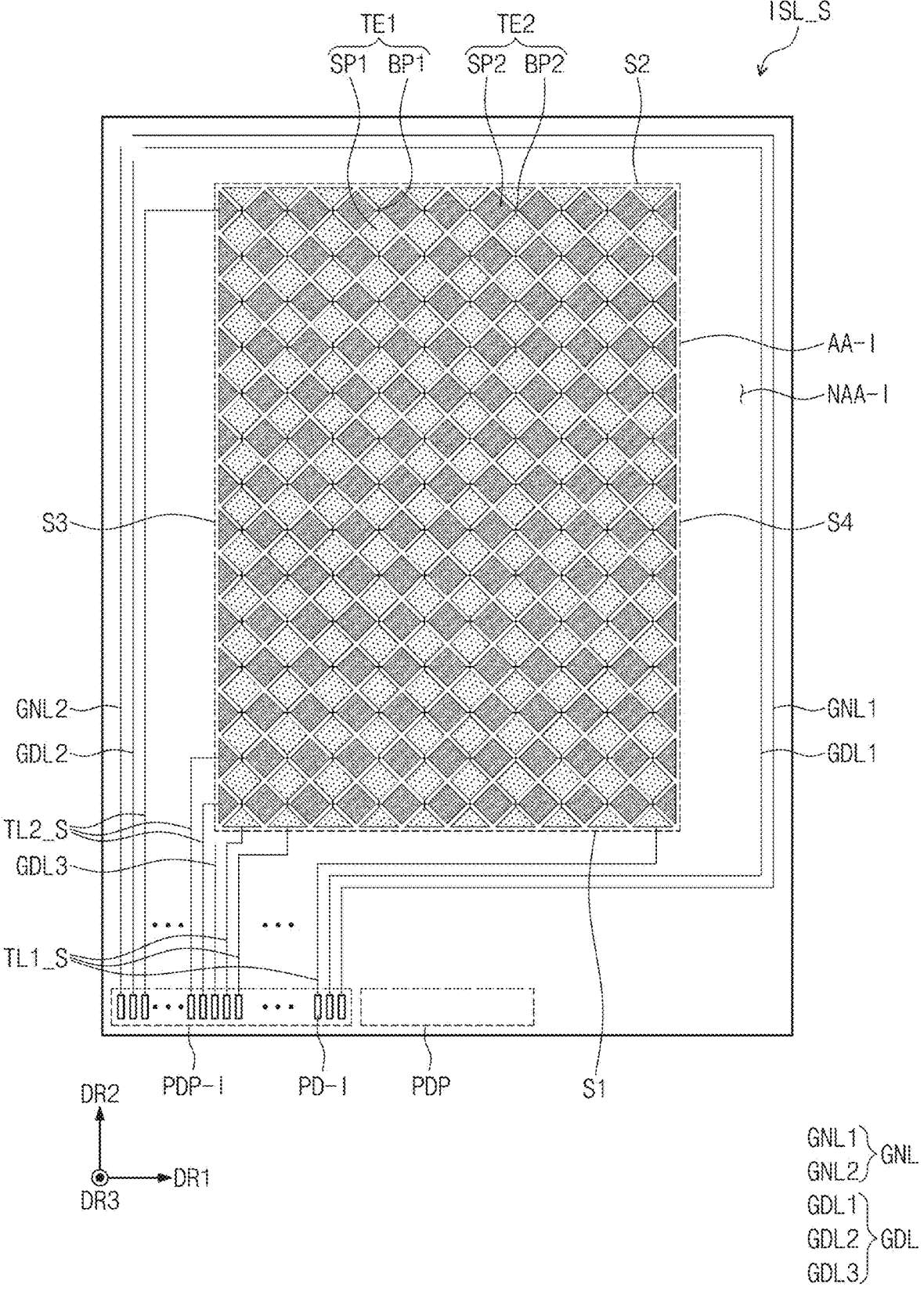
FIG. 15 is a plan view of a reference input sensor according to an embodiment of the inventive concept.
Figure 16A:
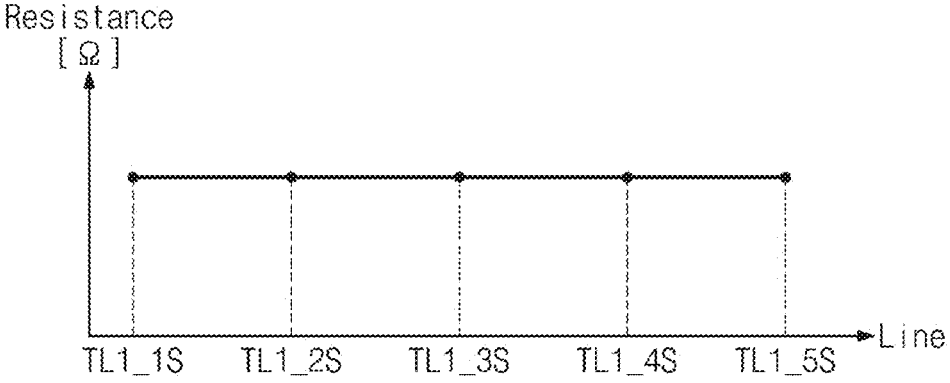
FIG. 16A is a graph showing resistance values of first reference detection wires according to an embodiment of the inventive concept.
Figure 16B:
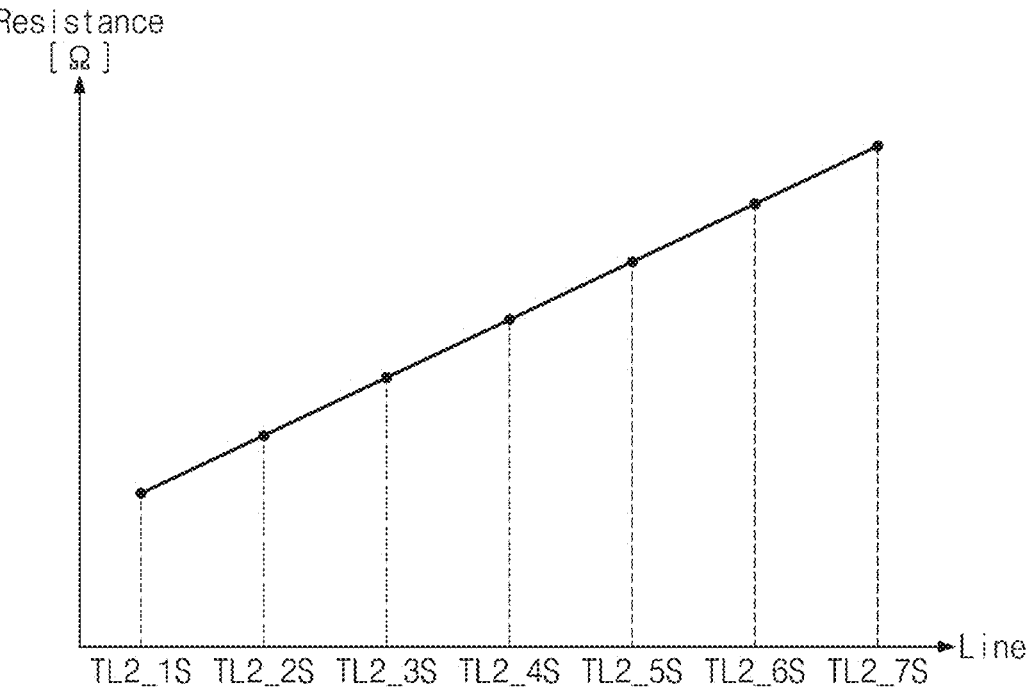
FIG. 16B is a graph showing resistance values of second reference detection wires according to an embodiment of the inventive concept.

FIG. 15 is a plan view of a reference input sensor according to an embodiment of the inventive concept. FIG. 16A is a graph showing resistance values of first reference detection wires according to an embodiment of the inventive concept. FIG. 16B is a graph showing resistance values of second reference detection wires according to an embodiment of the inventive concept. Hereinafter, the reference display device providing operation in S1 will be described with reference to FIGS. 15 to 16B.

In this embodiment, the reference display device may include the display panel DP (see FIG. 4A) and the reference input sensor ISL_S disposed on the display panel DP (see FIG. 4A). The description of the display panel DP (see FIG.

4A) may be equally applied to the description described above with reference to FIGS. 2 to 4B.

The reference input sensor ISL_S may include components of any one of the input sensors ISL described above with reference to FIGS. 6, 13, and 14. In this embodiment, the reference input sensor ISL_S may include a plurality of detection electrodes TEL and TE2, a plurality of reference detection wires TL1_S and TL2_S, an input pad part PDP-I, at least one ground wire GNL, and at least one guard wire GDL.

The plurality of detection electrodes TEL and TE2 may include first detection electrodes TE1 (or first reference detection electrodes) arranged in the first direction DR1 and second detection electrodes TE2 (or second reference detection electrodes) arranged in the second direction DR2.

Hereinafter, the reference detection wires TL1_S and TL2_S are provided in the form of the detection wires TL1 and TL2 of FIG. 6 as an example, but are not necessarily limited to this, and depending on the detection wires to be manufactured, reference detection wires may be provided in the form of detection wires TL1, TL2, and TL3 in FIG. 13 and detection wires TL1 and TL2 in FIG. 14.

In this embodiment, the plurality of reference detection wires TL1_S and TL2_S may include first reference detection wires TL1_S and second reference detection wires TL2_S.

As shown in FIG. 16A, the first reference detection wires TL1_1S, TL1_2S, TL1_3S, TL1_4S, and TL1_5S may have substantially the same resistance values. According to one embodiment, the first reference detection wires TL1_1S, TL1_2S, TL1_3S, TL1_4S, and TL1_5S may have lengths that increase in the first direction DR1 and widths that decrease in the first direction DR1.

As shown in FIG. 16B, the second reference detection wires TL2_1S, TL2_2S, TL2_3S, TL2_4S, TL2_5S, TL2_6S, and TL2_7S may be provided with gradually increasing resistance values as the connected second detection electrode TE2 gets farther from the input pad part PDP-I. Here, the resistance increase rate for the adjacent second reference detection wires TL2_1S, TL2_2S, TL2_3S, TL2_4S, TL2_5S, TL2_6S, and TL2_7S may be constant in all of the second reference lines TL2_1S, TL2_2S, TL2_3S, TL2_4S, TL2_5S, TL2_6S, and TL2_7S.

According to an embodiment, the second reference detection wires TL2_1S, TL2_2S, TL2_3S, TL2_4S, TL2_5S, TL2_6S, and TL2_7S have increased lengths as the connected $2^{nd}$ detection electrode TE2 gets farther from the input pad part PDP-I, and may be provided in a form having substantially the same width. However, the embodiment of the inventive concept is not necessarily limited to this, and according to the resistance increase rate of the adjacent second reference detection wires TL2_1S, TL2_2S, TL2_3S, TL2_4S, TL2_5S, TL2_6S, and TL2_7S, the tendency of the widths of the second reference detection wires TL2_1S, TL2_2S, TL2_3S, TL2_4S, TL2_5S, TL2_6S, and TL2_7S may vary.

Figure 17A:
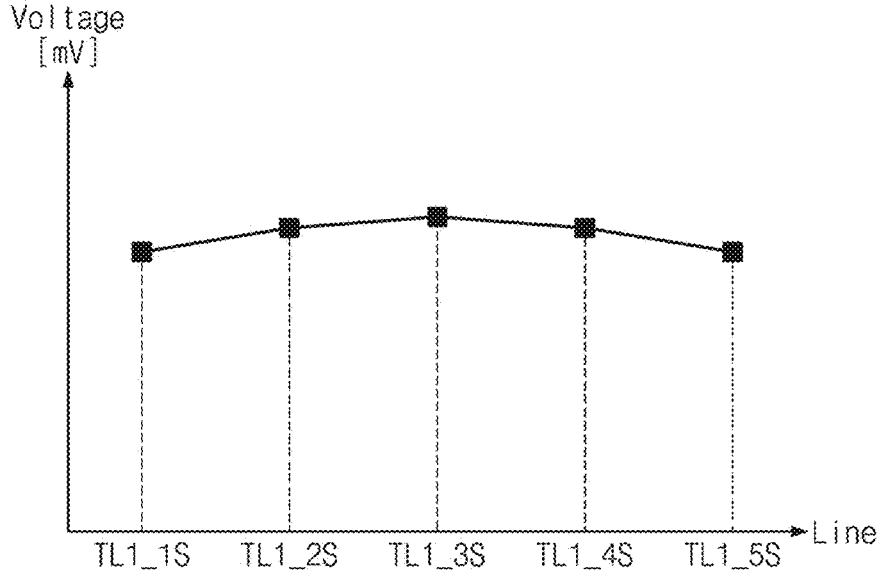
FIG. 17A is a graph showing maximum voltages of each of first reference detection wires according to an embodiment of the inventive concept.
Figure 17B:
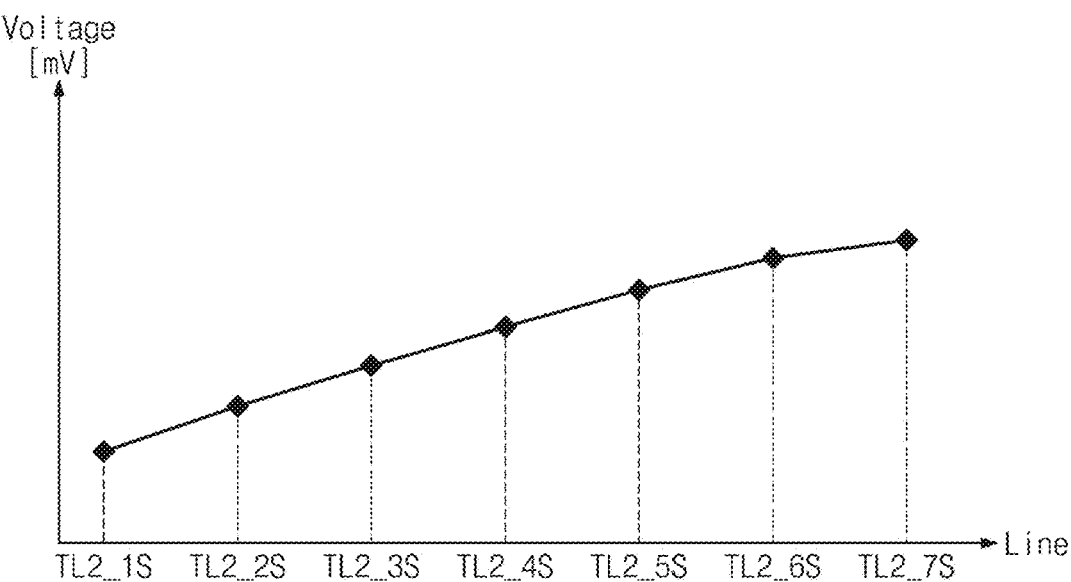
FIG. 17B is a graph showing the maximum voltage of each of the second detection wires according to an embodiment of the inventive concept.

FIG. 17A is a graph showing maximum voltages of each of first reference detection wires according to an embodiment of the inventive concept. FIG. 17B is a graph showing the maximum voltage of each of the second detection wires according to an embodiment of the inventive concept. Hereinafter, the noise measurement operation in S2 of the reference input sensor ISL_I will be described with reference to FIG. 15 and FIGS. 17A and 17B together.

In this embodiment, by measuring the voltage change for each of the first and second reference detection wires TL1_S and TL2_S of the reference input sensor ISL_I, noise tendencies of the first reference detection wires TL1_S and noise tendencies of the second reference detection wires TL2_S may be determined.

For example, after applying the same voltage to each of the first reference detection wires TL1_S, a change in voltage of each of the first reference detection wires TL1_S is measured, and after applying the same voltage to each of the second reference detection wires TL2_S, a voltage change of each of the second reference detection wires TL2_S may be measured. Voltage changes of the first and second reference detection wires TL1_S and TL2_S may be measured using an oscilloscope.

The noise tendency of the first reference detection wires TL1_S may be determined through the maximum voltage value derived from the voltage waveform graph of each of the first reference detection wires TL1_S. For example, it may be seen that relatively large noise is generated in the first reference detection wires TL1_S having a large maximum voltage value, and relatively small noise is generated in the first reference detection wires TL1_S having a small maximum voltage value. This description may be equally applied to the second reference detection wires TL2_S.

FIG. 17A is a graph showing maximum voltage values of first reference detection wires TL1_S, and illustrates that the first reference detection wires TL1_S include the first to fifth first reference detection wires TL1_1S, TL1_2S, TL1_3S, TL1_4S, and TL1_5S. The first to fifth first reference detection wires TL1_1S, TL1_2S, TL1_3S, TL1_4S, and TL1_5S are sequentially arranged in the first direction DR1, and references may be provided in correspondence with the first to fifth first detection wires TL1_1, TL1_2, TL1_3, TL1_4, and TL1_5 described above with reference to FIG. 7A.

The maximum voltage value may increase from the first first reference detection wire TL1_1S to the third first reference detection wire TL1_3S, and the maximum voltage value may increase from the fifth first reference detection wire TL1_5S to the third first reference detection wire TL1_S3. For example, it may be confirmed that the maximum voltage value of the first reference detection wires TL1_S increases as the connected first detection electrode TE1 approaches the center of the active area AA-I. In addition, it may be seen that the noise tendency of the first reference detection wires TL1_S is similar to the noise tendency of the second electrode CE of the display panel DP (see FIG. 4B) in the first direction DR1.

FIG. 17B is a graph showing maximum voltage values of second reference detection wires TL2_S and illustrates that the second reference detection wires TL2_S include the first to seventh second reference detection wires TL2_1S, TL2_2S, TL2_3S, TL2_4S, TL2_5S, TL2_6S, and TL2_7S. In the first to seventh second reference detection wires TL2_1S, TL2_2S, TL2_3S, TL2_4S, TL2_5S, TL2_6S, and TL2_7S, ends electrically connected to the second detection electrodes TE2 are sequentially arranged in the second direction DR2, and references may be provided in correspondence with the first to seventh second detection wires TL2_1, TL2_2, TL2_3, TL2_4, TL2_5, TL2_6, and TL2_7 described above with reference to FIG. 7B.

Going from the first second reference detection wire TL2_1S to the seventh second reference detection wire TL2_7S, the maximum voltage value may be increased and an increase rate of the maximum voltage value between adjacent second reference detection wires TL2_S may decrease. For example, the maximum voltage value of the second reference detection wires TL2_S increases as the connected second detection electrode TE2 moves away from the input pad part PDP-I, and the rate of increase of the maximum voltage value decreases.

Accordingly, it may be confirmed that the noise generated in the second reference detection wires TL2_S increases as the connected second detection electrode TE2 moves away from the input pad part PDP-I, and the noise increase rate decreases In addition, it may be seen that the noise tendency of the second reference detection wires TL2_S is similar to the noise tendency in the second direction DR2 of the second electrode CE (see FIG. 4B) of the display panel DP (see FIG. 4B).

Figure 18A:
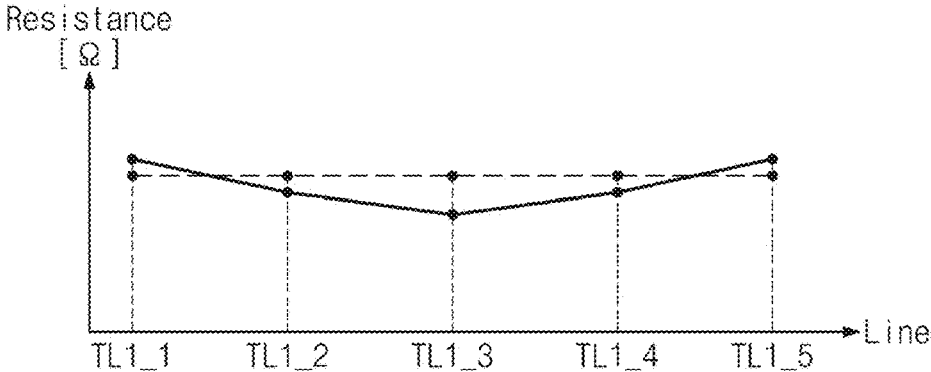
FIG. 18A is a graph showing first reference detection wires and resistances of each of the first detection wires according to an embodiment of the inventive concept.
Figure 18B:
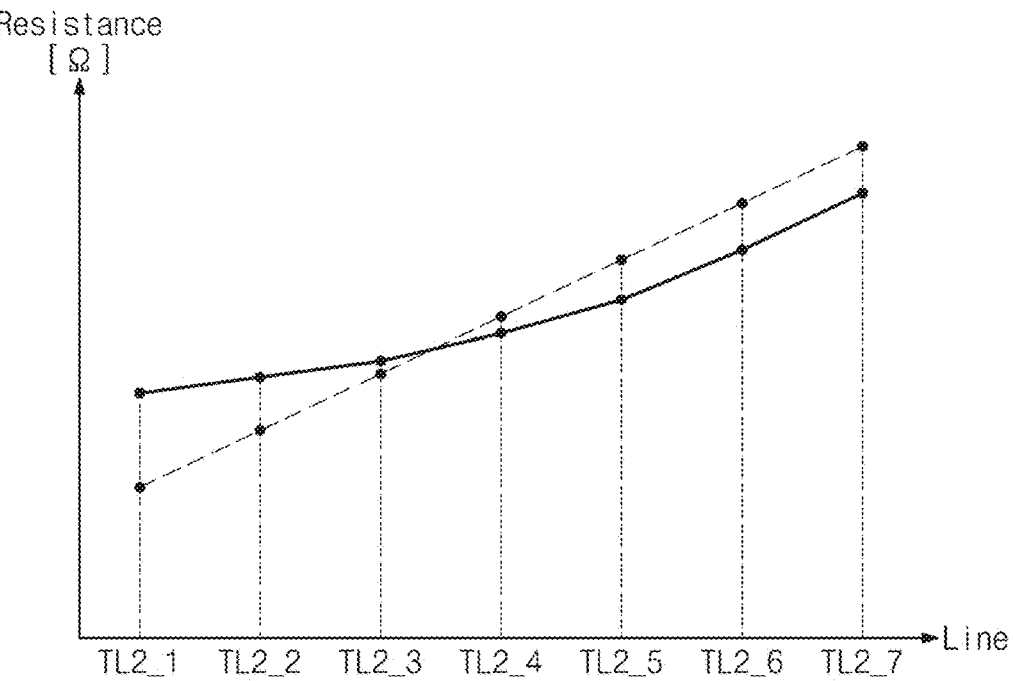
FIG. 18B is a graph showing resistances of the second reference detection wires and each of the second detection wires according to an embodiment of the inventive concept.

FIG. 18A is a graph showing resistances of first detection wires according to an embodiment of the inventive concept. FIG. 18B is a graph showing resistances of second detection wires according to an embodiment of the inventive concept. Hereinafter, with reference to FIGS. 6 and 15 and FIGS. 18A and 18B, the setting of the resistance of the first detection wires in S3, the setting of the resistance of the second detection wires in S4, and the forming of the input sensor in S5 will be described.

As shown in FIG. 18A, the method of manufacturing a display device according to an embodiment of the inventive concept may include setting the resistance of the first detection wires TL1. In an embodiment, resistance values of the first detection wires TL1 may be set in consideration of the noise tendency of the first reference detection wires TL1_S. FIG. 18A shows the resistance values of the first detection wires TL1 as solid lines, and for convenience of explanation, resistance values of the first reference detection wires TL1_S of FIG. 16A are shown together with dotted lines.

Considering the tendency that the noise generated in the first reference detection wires TL1_S increases towards the center, in order to reduce noise deviation in the first direction DR1 generated when the first reference detection wires TL1_S having the same resistance value are included, the first detection wires TL1 may be designed to have resistance values that become smaller as they are closer to the central portion.

FIG. 18A illustrates that resistance values of the first and fifth first detection wires TL1_1 and TL1_5 are set lower than resistance values of the first and fifth first reference detection wires TL1_1S and TL1_5S, respectively, and resistance values of the second to fourth first detection wires TL1_2 and TL1_4 are set higher than those of the second to fourth first reference detection wires TL1_2S and TL1_4S, respectively. However, the embodiment of the inventive concept is not necessarily limited to this, and resistance values of the first to fifth detection wires TL1_1, TL1_2, TL1_3, TL1_4, and TL1_5 may be set higher or lower than resistance values of the first to fifth first reference detection wires TL1_1S, TL1_2S, TL1_3S, TL1_4S, and TL1_5S, respectively.

As shown in FIG. 18B, the method of manufacturing a display device according to an embodiment of the inventive concept may include setting the resistance of the second detection wires TL2. In an embodiment, resistance values of the second detection wires TL2 may be set in consideration of the noise tendency of the second reference detection wires TL2_S. FIG. 18B shows the resistance values of the second detection wires TL2 as solid lines, and for convenience of explanation, the resistance values of the second reference detection wires TL2_S of FIG. 16B are shown together with dotted lines.

Considering the tendency that noise generated in the second reference detection wires TL2_S increases as the distance between the second detection electrode TE2 electrically connected to the input pad part PDP-I increases, and the noise increase rate decreases as the connected second detection electrode TE2 moves away from the input pad part PDP-I, in order to reduce noise deviation in the second direction DR2, resistance values of the second detection wires TL2 may be set.

In a part where the noise increase rate is relatively low, a relatively small noise deviation may occur, and in a part where the noise increase rate is relatively high, a relatively large noise deviation may occur. Therefore, in this embodiment, in relation to the noise generated in the second detection wires TL2, considering the tendency that the increase rate increases as the second detection electrode TE2 electrically connected to one end approaches the input pad part PDP-I, in order to reduce noise deviation in the second direction DR2 generated when the second reference detection wires TL2_S having resistance values increased at a constant rate are included, the second detection wires TE2 may be designed to have resistance values whose increase rate decreases as the second detection electrode TE2 electrically connected to one end approaches the input pad part PDP-I.

In FIG. 18B, resistance values of the first to third second detection wires TL2_1, TL2_2, and TL2_3 may be set higher than the resistance values of the first to third second reference detection wires TL2_1S, TL2_2S, and TL2_3S, respectively, and resistance values of the fourth to seventh second detection wires TL2_4, TL2_5, TL2_6, and TL2_7 may be set lower than resistance values of the fourth to seventh second reference detection wires TL2_4S, TL2_5S, and TL2_7S, respectively. Accordingly, by increasing the resistance value in the part where relatively low noise is generated and lowering the resistance value in the part where relatively high noise is generated, noise deviation in the second direction DR2 may be reduced.

However, the resistance values of the first to seventh second detection wires TL2_1, TL2_2, TL2_3, TL2_4, TL2_5, TL2_6, and TL2_7 may be set higher or lower than resistance values of the first to seventh second reference detection wires TL2_1S, TL2_2S, TL2_3S, TL2_4S, TL2_5S, TL2_6S, and TL2_7S, respectively.

Then, the method for manufacturing a display device according to an embodiment of the inventive concept may include forming an input sensor in S5. In the input sensor formation operation in S5, the detection wires TL1 and TL2 may be designed so that the detection wires TL1 and TL2 may have set resistance values and the input sensor ISL including the designed detection wires TL1 and TL2 may be formed. By changing the width, length, or width and length of the reference detection wires TL1_S and TL2_S, detection wires TL1 and TL2 with set resistance values may be designed.

It is possible to provide a display device DD (see FIG. 2) by forming an input sensor ISL including first and second detection wires TL1 and TL2 designed on the display panel DP (see FIG. 2). After manufacturing the input sensor ISL, by further proceeding with the attachment operations of the antireflection layer RPL (see FIG. 2), the panel protection film PPF (see FIG. 2), and the window WM (see FIG. 2), the display device DD (see FIG. 2) may be completed.

According to the inventive concept, after identifying the noise tendency in advance in the manufacturing process, by setting the resistance values of detection wires to reduce noise deviation, it is possible to provide an input sensor with increased electrical reliability and a display device with increased sensing reliability.

According to the inventive concept, resistance values of the detection wires of the input sensor may be set in consideration of the tendency of noise generated in the display panel. Through this, even if noise is generated in the input sensor due to electrical interference from the display panel, it is possible to reduce the deviation of noise according to the position. Through this, electrical reliability of the input sensor may be increased, and a display device having increased detection reliability may be provided.

According to the inventive concept, by measuring the noise of the reference detection wires in the reference input sensor, based on the noise tendency of the reference detection wires, the tendency of the resistance values of the detection wires of the input sensor may be set. Through this, it is possible to form an input sensor with increased electrical reliability and to provide a method for manufacturing a display device with increased detection reliability.

Although the embodiments of the inventive concept have been described, it is understood that the inventive concept should not necessarily be limited to these embodiments but various changes and modifications may be made by one ordinary skilled in the art within the spirit and scope of the inventive concept.

What is claimed is:

1. A method for manufacturing a display device, the method comprising:
   measuring a level of noise from a reference input sensor using a reference display device including a display panel and the reference input sensor disposed on the display panel; and
   forming a display device including the display panel and an input sensor including first detection electrodes arranged in a first direction, second detection electrodes arranged in a second direction crossing the first direction, first detection wires respectively electrically connected to the first detection electrodes, and second detection wires respectively electrically connected to the second detection electrodes and disposed on the display panel,
   wherein the forming of the display device comprises:
      setting resistances of the first detection wires based on the measured level of noise;
      setting resistances of the second detection wires based on the measured level of noise; and
      forming the input sensor on the display panel.

2. The method of claim 1, wherein resistance values of the first detection wires decrease as a corresponding first detection electrode among the first detection electrodes is disposed further towards a center of the display panel.

3. The method of claim 1, wherein the display device further comprises a circuit board disposed adjacent to an end of the display panel extending in the first direction and electrically connected to the first and second detection wires,
   wherein resistance values of the second detection wires increase as a corresponding second detection electrode, among the second detection electrodes, moves away from the circuit board, and a difference between the resistance values of neighboring members of the second detection wires increases as the corresponding second detection electrode moves away from the circuit board.

4. The method of claim 1, wherein the reference display device further comprises a circuit board disposed adjacent to an end of the display panel extending in the first direction,
   wherein the reference input sensor comprises:
      first reference detection electrodes arranged in the first direction;

second reference detection electrodes arranged in the second direction;

first reference detection wires respectively electrically connected to the first reference detection electrodes; and second reference detection wires respectively electrically connected to the second reference detection electrodes, wherein resistance values of the first reference detection wires are substantially the same as one another, and wherein resistance values of the second reference detection wires respectively electrically connected to the second reference detection electrodes arranged in a direction away from the circuit board increase at a constant rate.

5. The method of claim 4, wherein noise generated in the first reference detection wires increases as a corresponding first reference detection electrode among the first reference detection electrodes is disposed further towards a center of the display panel.

6. The method of claim 4, wherein the setting of the resistance values of the first detection wires comprises setting a tendency of resistance values of the first detection wires based on a tendency of noise generated in the first reference detection wires.

7. The method of claim 4, wherein noise generated in the second reference detection wires increases as a corresponding second reference detection electrode, among the second reference detection electrodes, moves away from the circuit board, wherein a noise increase rate between adjacent second reference detection wires decreases as a corresponding second reference detection electrode moves away from the circuit board.

8. The method of claim 4, wherein the setting of the resistance values of the second detection wires comprises setting a tendency of resistance values of the second detection wires based on a tendency of noise generated in the second reference detection wires.

9. The method of claim 4, wherein the measuring of the noise in the reference input sensor comprises measuring a voltage change of each of the first reference detection wires and the second reference detection wires.

10. The method of claim 4, wherein the forming of the input sensor comprises:

controlling a length or width of each of the first detection wires based on a length and width of each of the first reference detection wires to form the first detection wires, each having a set resistance; and controlling a length or width of each of the second detection wires based on a length and width of each of the second reference detection wires to form the second detection wires, each having a set resistance.

\* \* \* \* \*